(12) United States Patent
Bruzzone et al.

(10) Patent No.: US 12,230,854 B2
(45) Date of Patent: *Feb. 18, 2025

(54) SYSTEM WITH MAGNETIC FILM FOR REDUCING PASSIVE INTERMODULATION

(71) Applicant: 3M INNOVATIVE PROPERTIES COMPANY, St. Paul, MN (US)

(72) Inventors: Charles L. Bruzzone, Woodbury, MN (US); Jeffrey A. Tostenrude, Leander, TX (US); Zohaib Hameed, Woodbury, MN (US); Jeffrey D. Keeney, Hudson, WI (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/504,212

(22) Filed: Nov. 8, 2023

(65) Prior Publication Data
US 2024/0072404 A1 Feb. 29, 2024

Related U.S. Application Data

(63) Continuation of application No. 18/245,240, filed as application No. PCT/IB2021/058252 on Sep. 10, 2021, now Pat. No. 11,848,471.

(Continued)

(51) Int. Cl.
*H01Q 1/00* (2006.01)
*H01P 1/04* (2006.01)
(Continued)

(52) U.S. Cl.
CPC ............ *H01P 1/23* (2013.01); *H01Q 1/002* (2013.01); *H03C 7/022* (2013.01); *H04B 1/0475* (2013.01)

(58) Field of Classification Search
None
See application file for complete search history.

(56) References Cited

U.S. PATENT DOCUMENTS

| 7,233,217 B2 | 6/2007 | Phillips et al. |
| 8,251,581 B2 * | 8/2012 | Clothier ............ H05B 6/062 |
| | | 374/176 |

(Continued)

OTHER PUBLICATIONS

Bruzzone et al., "Magnetic Absorbers for Passive Intermodulation Mitigation", U.S. Appl. No. 18/139,015, filed Apr. 25, 2023.
(Continued)

*Primary Examiner* — Pablo N Tran
(74) *Attorney, Agent, or Firm* — Clifton F. Richardson

(57) ABSTRACT

A wireless communication system includes a transmitter configured to transmit at least first and second radio waves having respective different frequencies F1 and F2, an electrically conductive first passive substantially linear medium, an electrically conductive first passive substantially nonlinear medium disposed proximate the first passive substantially linear medium, and a first magnetic film covering at least a portion of the first passive substantially linear medium. When the transmitter transmits the first and second radio waves, the first passive substantially linear and nonlinear media receive the first and second radio waves and generate first and second signals propagating therein at the respective frequencies F1 and F2. At least one intermodulation signal having a frequency F3 equal to nF1+mF2, where m and n positive or negative integers, is generated in the first passive substantially nonlinear medium. The first magnetic film reduces the at least one intermodulation signal by at least 2 dB.

19 Claims, 15 Drawing Sheets

Related U.S. Application Data

(60) Provisional application No. 63/085,525, filed on Sep. 30, 2020.

(51) Int. Cl.
    *H01P 1/23*     (2006.01)
    *H01Q 19/08*     (2006.01)
    *H03C 7/02*     (2006.01)
    *H04B 1/04*     (2006.01)
    *H04B 3/52*     (2006.01)

(56) References Cited

U.S. PATENT DOCUMENTS

| | | |
|---|---|---|
| 10,411,349 B2 | 9/2019 | Black et al. |
| 10,422,704 B2 * | 9/2019 | Bonifas .................... G01K 7/38 |
| 10,854,960 B2 * | 12/2020 | Bean ...................... H01Q 1/248 |
| 11,165,391 B2 * | 11/2021 | Bruzzone ............... H01Q 1/002 |
| 11,699,976 B2 | 7/2023 | Bruzzone et al. |
| 2011/0050530 A1 | 3/2011 | Hnatiw |
| 2012/0139656 A1 * | 6/2012 | Henrie .................... H01P 5/028 |
| | | 333/260 |
| 2018/0148608 A1 | 5/2018 | Bell et al. |
| 2018/0358708 A1 * | 12/2018 | Ben-Bassat .......... H04B 10/541 |
| 2020/0014363 A1 | 1/2020 | Yi et al. |
| 2020/0350652 A1 * | 11/2020 | Ondracek ................ H01Q 5/50 |
| 2021/0119339 A1 | 4/2021 | Smith, Jr. et al. |
| 2021/0265951 A1 | 8/2021 | Bruzzone et al. |
| 2022/0052643 A1 | 2/2022 | Bruzzone et al. |

OTHER PUBLICATIONS

International Search Report for PCT Application No. PCT/IB2021/058252, mailed on Nov. 30, 2021, 3 pages.

Takeda, "Theoretical Consideration on Short- & Open-circuited Transmission Lines for Permeability & Permittivity Measurement", Journal of the Magnetics Society of Japan, 2015, vol. 39, pp. 116-120.

* cited by examiner

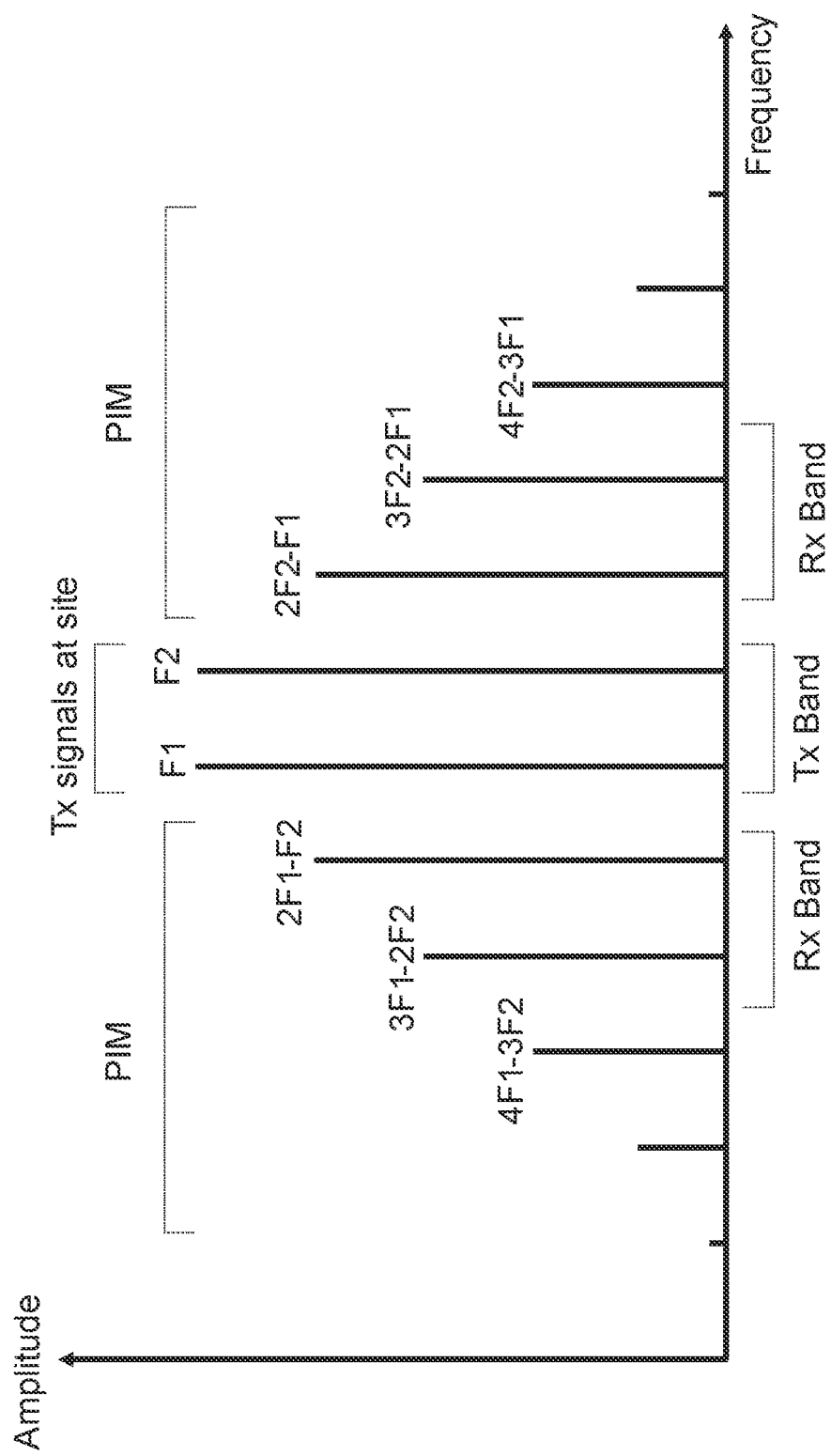

SYSTEM WITH MAGNETIC FILM FOR REDUCING PASSIVE INTERMODULATION

CROSS-REFERENCE TO RELATED APPLICATIONS

This application is a continuation of U.S. application Ser. No. 18/245,240, filed Mar. 14, 2023, which is a national stage filing under 35 U.S.C. 371 of PCT/IB2021/058252, filed Sep. 10, 2021, which claims the benefit of U.S. Application No. 63/085,525, filed Sep. 30, 2020, the disclosures of which are incorporated by reference in their entireties herein.

BACKGROUND

As wireless communication networks evolve, signal quality (and, more specifically, signal-to-noise ratio, or SNR) becomes increasingly important. Higher orders of modulation are used to achieve very high data rates and require correspondingly higher levels of SNR. A common cause of SNR degradation is Passive Intermodulation (PIM) distortion, which can significantly reduce the performance and capacity of a network. PIM distortion is created when multiple frequencies encounter a non-linear material or feature, which then generate sum and difference combinations (products) of the fundamental frequencies and their harmonics. The resulting products often occur in uplink/receive frequency bands where the signal of interest is very weak, making coherent reception very difficult or impossible.

There are many mechanisms through which PIM can be created or propagated. Typically, the interactions and interconnections of electrically conductive mechanical components in a system can create a nonlinear element in the system. A nonlinearity may, in some cases, be caused by poor metal-to-metal contact at the location of an antenna mounting bracket, or if the bracket comprises a junction between dissimilar materials. Other causes of nonlinearities may be contamination, loose connections, nearby metal objects, or a variety of other causes.

SUMMARY

The present description relates generally to systems, such as wireless communication systems, that include at least one magnetic film. The magnetic film can be included to mitigate the effects of passive intermodulation distortion in wireless communication systems.

In some aspects of the present description, a wireless communication system is provided. The wireless communication system includes a transmitter configured to transmit at least first and second radio waves having respective different frequencies F1 and F2, an electrically conductive first passive substantially linear medium, an electrically conductive first passive substantially nonlinear medium disposed proximate the first passive substantially linear medium, and a first magnetic film covering at least a first portion of the first passive substantially linear medium and no more than about 20% of any electrically conductive passive substantially nonlinear medium. When the transmitter transmits the first and second radio waves, the first passive substantially linear and nonlinear media receive the first and second radio waves and generate first and second signals propagating therein at the respective frequencies F1 and F2. At least one intermodulation signal is generated in the first passive substantially nonlinear medium from the first and second signals. The at least one intermodulation signal has a frequency F3 equal to nF1+mF2, where m and n are positive or negative integers. The first magnetic film reduces the generation of the at least one intermodulation signal by at least 2 dB.

In some aspects of the present description, a wireless communication system is provided. The wireless communication system includes a transmitter configured to transmit at least first and second radio waves having respective different frequencies F1 and F2, an electrically conductive first passive substantially nonlinear medium portion, and an electrically conductive first passive substantially linear medium portion disposed proximate the first passive substantially nonlinear medium portion, such that when the transmitter transmits the first and second radio waves, the first passive substantially linear medium portion receives the first and second radio waves and generates first and second signals at the respective frequencies F1 and F2. The first and second signals propagate in the first passive substantially linear medium portion toward the electrically conductive first passive substantially nonlinear medium portion along a first path. An intermodulation signal is generated in the first passive substantially nonlinear medium portion from the first and second signals. The intermodulation signal has a frequency F3 equal to nF1+mF2, where m and n positive or negative integers. The wireless communication system further includes a first magnetic film covering at least a first portion of the first passive substantially linear medium portion along the first path and disposed to attenuate the generated first and second signals propagating in the first passive substantially linear medium portion more than the generated intermodulation signal in the first passive substantially nonlinear medium portion.

In some aspects of the present description, a system for reducing passive intermodulation is provided. The system includes an electrically conductive first passive substantially linear medium configured to receive first and second radio waves having respective different frequencies F1 and F2 and generate first and second signals at the respective frequencies F1 and F2. The first and second signals propagate in the first passive substantially linear medium toward an electrically conductive first passive substantially nonlinear medium along a first path. An intermodulation signal is produced in the first passive substantially nonlinear medium from the first and second signals. The intermodulation signal has a frequency F3 equal to nF1+mF2, where m and n positive or negative integers. The system further includes a first magnetic film covers at least a first portion of the first passive substantially linear medium along the first path and no more than about 20% of the first passive substantially nonlinear medium.

In some aspects of the present description, a system for reducing passive intermodulation is provided. The system includes an electrically conductive first passive substantially linear medium configured to receive first and second radio waves having respective different frequencies F1 and F2 and generate first and second signals at the respective frequencies F1 and F2. The first and second signals propagate in the first passive substantially linear medium toward an electrically conductive first passive substantially nonlinear medium along a first path. An intermodulation signal is produced in the first passive substantially nonlinear medium from the first and second signals. The intermodulation signal has a frequency F3 equal to nF1+mF2, where m and n positive or negative integers. The system further includes a first magnetic film covering a first portion of the first passive substantially linear medium along the first path and leaving exposed a second portion of the first passive substantially linear medium. The first magnetic film faces the first passive substantially nonlinear medium and the second portion faces away from the first passive substantially nonlinear medium.

These and other aspects will be apparent from the following detailed description. In no event, however, should this brief summary be construed to limit the claimable subject matter.

BRIEF DESCRIPTION OF THE DRAWINGS

FIG. 7 is a schematic graph illustrating transmission and intermodulation frequencies of a wireless communication system, in accordance with an embodiment of the present description;

DETAILED DESCRIPTION

Figure 1:
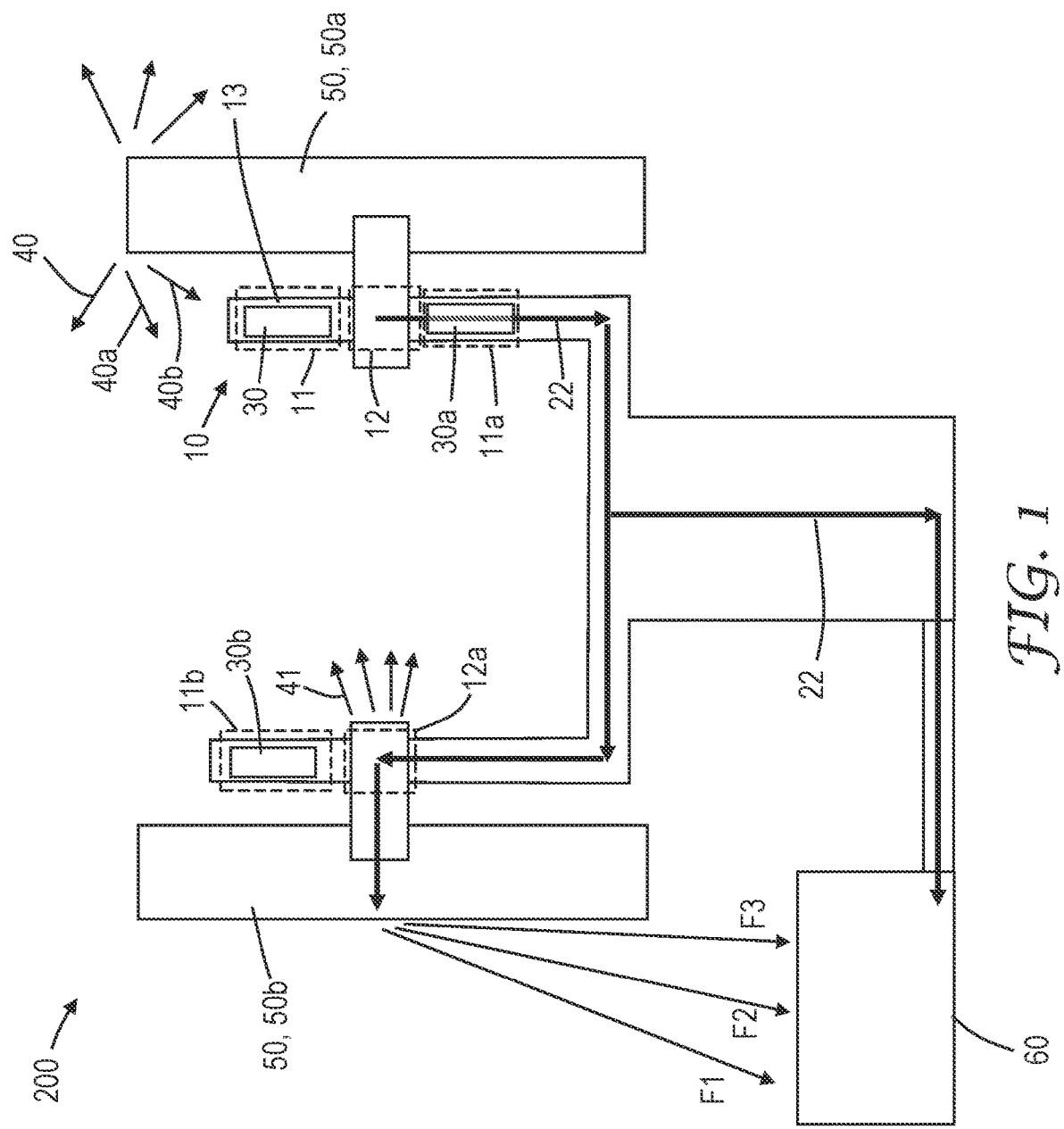
FIG. 1 is a schematic side view of a wireless communication system, in accordance with an embodiment of the present description.

In the following description, reference is made to the accompanying drawings that form a part hereof and in which various embodiments are shown by way of illustration. The drawings are not necessarily to scale. It is to be understood that other embodiments are contemplated and may be made without departing from the scope or spirit of the present description. The following detailed description, therefore, is not to be taken in a limiting sense.

As wireless communication networks evolve, signal quality (and, more specifically, signal-to-noise ratio, or SNR) becomes increasingly important. Higher orders of modulation (64QAM, 256QAM, etc.) are used to achieve very high data rates and require correspondingly higher levels of SNR. A common cause of SNR degradation is Passive Intermodulation (PIM) distortion, which can significantly reduce the performance and capacity of a network. PIM distortion ("PIM" for short) is created when multiple frequencies encounter a non-linear material or feature, which then generate sum and difference combinations (products) of the fundamental frequencies and their harmonics. The resulting products, typically $3^{rd}$, $5^{th}$ and/or $7^{th}$ order products, often occur in uplink/receive frequency bands where the signal of interest is very weak, making coherent reception very difficult or impossible.

PIM is a form of electromagnetic interference that occurs in a wireless communication system when the system simultaneously transmits signals at multiple frequencies through passive devices, such as cables, connectors, antennas, mounting brackets, and other objects in or in proximity to the system's transmission path. PIM interference becomes particularly pronounced in nodes that transmit at high power, such as a cellular base station antenna. PIM is generated when two or more signals at different frequencies mix with each other due to nonlinearities in mechanical components of the system. Two signals may combine (through amplitude modulation) to produce sum and difference signals, including within the harmonic of the signals, within the operating bands of the wireless system, causing interference.

There are many mechanisms through which PIM can be created or propagated. Typically, the interactions and interconnections of electrically conductive mechanical components in a system can create a nonlinear element in the system. A nonlinearity may, in some cases, be caused by poor metal-to-metal contact at the location of an antenna mounting bracket, or if the bracket comprises a junction between dissimilar materials. For example, the fundamental frequencies (e.g., F1 and F2) of a cellular base station may be radiated by an antenna mounted on a galvanized steel mast. When signals (e.g., electric currents and/or electric voltages) are induced in the steel mast at these frequencies, those signals may encounter the mounting bracket (i.e., the nonlinearity), and be mixed within the nonlinearity to form a third signal (i.e., the intermodulation signal) at a new frequency, F3. The intermodulation signal may be radiated from the bracket as PIM, and/or conducted away from the bracket by a conductive linear portion, which may act as an antenna for the PIM and radiate the PIM out with even better efficiency than the nonlinear bracket. Electrically conductive shields are often applied to encapsulate the bracket, preventing the PIM from being radiated by the bracket, but intermodulation signal (e.g., current) may still travel from the bracket throughout the structure as well as to other antennas, eventually re-radiating and degrading the network.

Other causes of nonlinearities (and, therefore, PIM) may be contamination, (e.g., rust, corrosion, dirt, oxidation, etc.), loose connections, nearby metal objects (e.g., guy wires, anchors, roof flashing, pipes, etc.), or a variety of other causes.

According to some aspects of the present description, a wireless communication system (e.g., a system including a cellular base station as a component) includes an electrically-conductive, passive medium (e.g., the metallic structure of an antenna mast) capable of simultaneously propagating therealong electromagnetic first and second signals at different respective frequencies F1 and F2. In some embodiments, at least one of the first and second signals includes an electric current. In some embodiments, at least one of the first and second signals includes an electric voltage. In some embodiments, the first and second signals may be generated by two radio frequency (RF) signals being transmitted at similar but different frequencies (i.e., F1 and F2). In some embodiments, each of F1 and F2 is between about 100 MHz and about 10 GHz, or between about 200 MHz and about 5 GHz, or between about 300 MHz and about 3 GHz. In some such embodiments or in other embodiments, a difference between F1 and F2 is between about 5 MHz and about 1 GHz, or between about 10 MHz and about 900 MHz, or between about 10 MHz and about 800 MHz, or between about 10 MHz and about 700 MHz.

For example, in one embodiment, F1 may be 869 MHz and F2 may be 894 MHz, with an adjacent receive band for signals returned from external devices (e.g., a mobile device). For example, an adjacent receive band may be between 824 and 849 MHz. Another receive band may be adjacent at a frequency range above the transmit band (i.e., frequencies above the range of transmit band frequencies). These fundamental frequencies may mix to create products at new frequencies based on the formula nF1+mF2, where m and n may be positive or negative integers. Simple addition of the modulated signals (e.g., when both m and n are +1) in this example would produce a signal of 869+894=1763 MHz, and a difference (e.g., when n is +1 and m is −1) between the signals would be 894−869=25 MHz. Both 25 MHz and 1763 MHz are out of the receive bands of interest for a cellular system, and so these signals would not be of concern for that particular cellular system (although these frequencies may fall within the receive band or spectrum of interest of another, nearby system, and so may still cause PIM interference in those systems). However, when these signals combine to form third order (when the sum of the absolute values of m and n is 3) and sometimes higher order products, these can generate PIM signals within the receive bands of interest. For example, 2F1−F2 (844 MHz) and 2F2−F1 (919 MHz) produce 3rd order products within the receive portion of a cellular band that can lead to PIM distortion.

In some embodiments, the electrically conductive passive medium includes an electrically-conductive, first passive substantially linear medium portion adjacent an electrically-conductive, first passive substantially nonlinear medium portion. An intermodulation signal can be generated in the first passive substantially nonlinear medium portion from the first and second signals. The intermodulation signal may be generated based on a nonlinear interaction between the first and second signals (e.g., an indirect interaction arising from the first and second signals interacting with the first passive substantially nonlinear medium). For example, in some embodiments, the electrically-conductive, first passive substantially linear medium portion may be the metallic mast (e.g., a galvanized steel mast) to which a cellular antenna is mounted, and the electrically-conductive, first passive substantially nonlinear medium portion may be a mounting bracket of a dissimilar metal. This junction or meeting point of dissimilar materials may create a nonlinearity that acts similar to a diode which causes the first and second signals (at frequencies F1 and F2) to mix to create an intermodulation signal (PIM) at a new frequency. In some embodiments, the nonlinearity may be created by a junction between two dissimilar metals. In some embodiments, the nonlinearity may be created by a junction between a metal and a metal oxide (e.g., a metal oxide caused by oxidation effects). In some embodiments, the nonlinearity may be reacted by an area of corrosion or contamination (e.g., a region of rust, a contaminant such as dirt, poor metal-to-metal contact, etc.).

A medium portion is a portion of a medium. A medium portion can be a medium or a contact point or junction between adjacent materials, for example. A contact point or junction between adjacent materials can define a substantially nonlinear medium as the medium which includes the junction or contact point, and which has electrical properties significantly affected by the junction or contact point. For example, in some embodiments, for a nonlinearity created by a junction between two metals having different Fermi levels, a transfer of charge across the junction occurs to create a dipole which equalizes the Fermi levels and which significantly affects the electrical properties in a thin region (e.g., having a thickness which is small compared to overall dimensions of the metals, but which can be large compared to atomic lattice spacings of the metals) around the junction such that this region defines a substantially nonlinear medium. The first (resp., second, third, etc., where included) passive substantially linear medium portion may be a first (resp., second, third, etc.) passive substantially linear medium, since a portion of a medium can be considered to be a medium, and similarly, the first (resp., second, third, etc., where included) passive substantially nonlinear medium portion may be a first (resp., second, third, etc.) passive substantially nonlinear medium.

In some embodiments, a first magnetic film may be disposed proximate an electrically-conductive, external surface of the first substantially linear portion. In some embodiments, the wireless communication system may further include an electrically conductive second passive substantially linear medium portion adjacent the electrically conductive first passive substantially nonlinear medium portion opposite the first passive substantially linear medium portion (e.g., the substantially nonlinear portion may be "sandwiched" between the first substantially linear portion and the second substantially linear portion). In some embodiments, a second magnetic film may be disposed proximate an electrically-conductive, external surface of the second substantially linear portion, such that when the first and second signals propagate along the first substantially linear portion toward the substantially nonlinear portion, the first magnetic film reduces the generation of the intermodulation signal in the first substantially nonlinear portion by absorbing a portion of the first and second signals. In some embodiments, at least some of remaining portions of the first and second signals may mix in the first substantially nonlinear portion, generating an intermodulation signal which propagates through the first substantially nonlinear portion and the second linear portion, where the intermodulation signal is at least partially absorbed by the second magnetic film.

In some embodiments, the first and second signals may be induced by electromagnetic radiation transmitted from an antenna coupled to the electrically-conductive passive substantially linear medium. In some embodiments, the first and second signals may be induced by electromagnetic radiation radiated from a second passive substantially nonlinear medium which is coupled to the first passive substantially linear medium portion. That is, PIM distortion may be created in a second substantially nonlinear portion coupled to the substantially linear portion and radiated from the second substantially nonlinear portion, causing the signals to be induced in the substantially linear portion.

In some embodiments, the intermodulation signal may have a frequency F3 equal to nF1+mF2 which propagates along the first passive substantially nonlinear medium, where m and n may be positive or negative integers. For example, as discussed elsewhere herein, n may be 2 and m may be −1, or n may be −1 and m may be 2. These values are examples only, and other values of n and m are possible. In some embodiments, one of m and n is a negative integer, and the other of m and n is a positive integer. In some embodiments, n may be equal to −1 and m equal to +2, such that F3 is equal to 2F2-F1. In some embodiments, n may be equal to +2 and m equal to −1, such that F3 is equal to 2F1-F2. In some embodiments, n may be equal to +1 and m equal to +1, such that F3 is equal to F1+F2. In some embodiments, n may be equal to +2 and m equal to +2, such that F3 is equal to 2F1+2F2. In some embodiments, F1 and F2 are both less than about 6 GHz. In some embodiments, both F1 and F2 are between about 600 MHz and 4 GHz. In some embodiments, both F1 and F2 are between about 600 MHz and 800 MHz. In some embodiments, F1 and F2 are frequencies which are less than about 100 MHz apart, or less than about 50 MHz apart.

In some embodiments, a first magnetic film is disposed proximate an electrically conductive external surface of the first substantially linear medium portion, such that when the first and second signals propagate along the first passive substantially linear medium portion toward the first passive substantially nonlinear medium portion, the magnetic film reduces the generation of the intermodulation current in the first passive substantially nonlinear medium by attenuating at least portions of the first and second signals (e.g., impede the propagation of the signal through the corresponding structure). In some embodiments, the magnetic film may reduce the intensity of the intermodulation radiation generated by and radiated from the first passive substantially nonlinear medium portion by at least 2 dB, or at least 3 dB, or at least 3.5 dB, or at least 4 dB, or at least 5 dB, or at least 6 dB (e.g., 2 dB to 100 dB or 3 dB to 50 dB).

A magnetic film may have a relative permeability having a real part greater than about 10 for at least one frequency in a range of about 100 MHz to about 10 GHz. A magnetic film may have a relative permeability having an imaginary part greater than about 5, or in any range described elsewhere herein, for at least one frequency in a range of about 100 MHz to about 10 GHz. The magnetic film may be electrically conductive or include an electrically conducive layer, or the magnetic film may be electrically nonconductive. An electrically nonconductive film may have an electrical resistivity of at least 100 Ωm (evaluated at low frequencies (e.g., about 1 kHz or less) or evaluated statically (direct current)) along each direction (e.g., along orthogonal in-plane directions and along a thickness direction) and for each layer of the film in some embodiments where the film has more than one layer. An electrically nonconductive film may also be referred to as an electrically insulative film.

In some embodiments, the first magnetic film, or other magnetic film, may be a magnetic absorber. One example of a magnetic absorber is the 3M™ EMI Shielding Absorber AB6000HF series of shielding films manufactured by 3M Company (St. Paul, MN). Other suitable magnetic absorbers include 3M™ Flux Field Direction Material (FFDM), such as 3M™ FFDM EM25TP, available from 3M Company. In some embodiments, the magnetic film includes an electrically conductive layer (e.g., 3M™ EMI Shielding Absorber AB6000HF films include an electrically conductive shielding layer). In other embodiments, no electrically conductive layer is included (e.g., 3M™ Flux Field Direction Material (FFDM) EM25TP films are available without a conductive layer).

In some embodiments, the magnetic film may attenuate the first and second signals by absorbing at least portions of the magnetic fields generated by the first and second signals. In some embodiments, the first magnetic film does not cover any portion of the first substantially nonlinear medium portion or does not cover any portion of any substantially nonlinear medium. In some embodiments, the first magnetic film covers at least a first portion of a first passive substantially linear medium (e.g., along a first path) and no more than about 50% of a first passive substantially nonlinear medium or no more than about 50% of any electrically conductive passive substantially nonlinear medium. In some embodiments, the first magnetic film covers at least a first portion of a first passive substantially linear medium (e.g., along a first path) and no more than about 20% of a first passive substantially nonlinear medium or no more than about 20% of any electrically conductive passive substantially nonlinear medium. In some embodiments, the first magnetic film covers at least a first portion of a first passive substantially linear medium (e.g., along a first path) and no more than about 10% of a first passive substantially nonlinear medium or no more than about 10% of any electrically conductive passive substantially nonlinear medium. X % (e.g., 50%, 20%, or 10%) of an electrically conductive passive substantially nonlinear medium refers to X % of an entire contiguous nonlinear portion of an electrically conductive passive medium and not just X % of some portion of the nonlinear portion. For example, in embodiments where a rusted portion of the first mounting bracket is a substantially nonlinear medium, X % of the electrically conductive passive substantially nonlinear medium refers to X % of the entire rusted portion of the first mounting bracket. As another example, in embodiments where a contiguous first rusted portion of the first mounting bracket is a first substantially nonlinear medium and a contiguous second rusted portion of the first mounting bracket or of a second mounting bracket is a second substantially nonlinear medium, where the first and second rusted portions are spaced apart from one another (i.e., the first and second rusted portions are not contiguous with one another), covering no more than about X % of any electrically conductive passive substantially nonlinear medium means that no more than X % of the entire first rusted portion is covered and that no more than X % of the entire second rusted portion is covered. Covering X % of an electrically conductive passive substantially nonlinear medium with a magnetic film can be understood to mean covering X % of the area of the substantially nonlinear medium facing the magnetic film. For example, in embodiments where a mounting bracket is the nonlinear medium, covering X % of the substantially nonlinear medium may be understood to mean covering X % by area of the outer surface of the mounting bracket. As another example, in embodiments where a substantially nonlinear medium is defined by a junction, covering X % of the substantially nonlinear medium can be understood to mean covering X % by area of the junction.

According to some aspects of the present description, a wireless communication system includes an antenna (e.g., a cellular antenna); an electrically conductive passive substantially linear medium portion electrically interconnected with an electrically conductive passive substantially nonlinear medium portion (e.g., the junction of two dissimilar materials, such as a mounting bracket and an antenna mast), such that when the antenna radiates electromagnetic first and second waves at different respective frequencies F1 and F2, the first and second waves induce respective first and second signals propagating through the first passive substantially nonlinear medium portion, the first passive substantially nonlinear medium portion mixing the first and second signals to generate a third signal (i.e., an intermodulation current, or PIM) having a frequency nF1+mF2 and propagating along the passive substantially nonlinear and substantially linear medium portions, where m and n are integers which may be either positive or negative. In some embodiments, a magnetic film may be disposed on the passive substantially linear, but not the substantially nonlinear, medium portion and absorbing at least a portion of the third signal. For example, in some embodiments, the magnetic film may be a magnetic absorbing film wrapped around an antenna mast (substantially linear medium portion) adjacent to and in the propagation pathway prior to an attached antenna mounting bracket (substantially nonlinear medium portion). In some embodiments, placement of the magnetic film on the substantially linear medium portion may impede the propagation of signals which may contribute to PIM interference (e.g., by attenuating the signals due at least in part to absorbing the magnetic field produced by the signals). In some embodiments, the magnetic film may be disposed on both the passive substantially linear medium portion and a portion of the passive substantially nonlinear medium portion. Attenuating signal(s) in the passive substantially linear medium can result in reduced intermodulation signals in the substantially nonlinear medium portion. The reduction in the intermodulation signal in the substantially nonlinear medium portion can be greater than the reduction of the signal(s) in the substantially linear medium portion. For example, for a third order (|m|+|n|=3) intermodulation signal, an approximately 3 dB reduction in the power of intermodulation signal in the substantially nonlinear medium portion can occur for every 1 dB reduction in the power of the signal(s) in the substantially linear medium portion. In some embodiments, the magnetic film is disposed primarily to attenuate at least portions of the first and second signals propagating in the first passive substantially linear medium portion. A magnetic film that covers only portion(s) of a passive substantially linear medium portion, or that covers portion(s) of the passive substantially linear medium portion and portion(s) of a substantially nonlinear medium portion such that the magnetic film results in a larger attenuation of intermodulation signal(s) due to attenuating at least portions of first and second signals propagating in the passive substantially linear medium portion than due to attenuating at least portions of signal(s) in the substantially nonlinear medium portion, may be described being disposed primarily to attenuate at least portions of the first and second signals propagating in the first passive substantially linear medium portion.

According to some aspects of the present description, a wireless communication system (e.g., a cellular base station) may include one or more antennas; a plurality of spaced apart electrically conductive first sections (e.g., one or more mounting brackets, or an irregular weld); a plurality of electrically conductive second sections (e.g., sections of an antenna mast) interconnecting the first sections, such that when the one or more antennas radiate electromagnetic first and second waves at different respective frequencies F1 and F2, the first and second waves induce respective first and second signals at the respective F1 and F2 frequencies, which may propagate through the first and second sections. In some embodiments, the first sections may cause the mixing of the first and second signals (e.g., combining through amplitude modulation) to generate a third signal (e.g., an intermodulation signal) at a frequency F3 different from F1 and F2. In some embodiments, the generated third signal may propagate along the first and second sections, causing the first, but not the second, sections to generate electrical signals at the new F3 frequency, which may be propagated along the second section which may then radiate electromagnetic energy at the frequencies F3. In some embodiments, the second section may also generate an electrical signal at the F3 frequency, which may contribute to the radiated electromagnetic energy. In some embodiments, this "mixing" of signals may be caused by a nonlinearity in the first sections. For example, corrosion on a mounting bracket, or a loose connection, or any number of other causes, may cause the nonlinearity in the first section, causing the first section to act as a signal (e.g., current or voltage) mixer, producing a third (intermodulation) signal based on the first and second signals and their respective frequencies. In some embodiments, a magnetic film (e.g., a magnetic absorber) may be disposed on an electrically conductive surface of each second section (e.g., wrapped around or placed on an external surface of the section) to absorb at least a portion of the third signal propagating along the second section.

According to some aspects of the present description, a wireless communication system is provided including one or more antennas (e.g., multiple cellular antennas on a cellular base station); one or more transceivers (e.g., transceivers housed in a base transceiver station, or BTS, used to facilitate wireless communication between mobile devices and a cellular network) coupled to the one or more antennas; a plurality of electrically conductive passive substantially linear medium portions interconnected with a plurality of electrically conductive passive nonlinear medium portions, and a magnetic film (e.g., magnetic absorber) disposed on at least some of the substantially linear, but none of the substantially nonlinear, medium portions. In some embodiments, each substantially linear and substantially nonlinear medium portion may be capable of simultaneously propagating electromagnetic first and second signals at different respective frequencies F1 and F2. In some embodiments, each passive substantially nonlinear portion, but not substantially linear portion, may be capable of mixing or otherwise combining the first and second signals to generate a third signal having a frequency nF1+mF2, where m and n are positive or negative integers. In some embodiments, the third signal propagates along the passive substantially nonlinear medium portion and/or along the passive substantially linear portion. In some embodiments, the magnetic absorbers placed on the linear portions may impede the formation of signals in the substantially linear portions which could otherwise contribute to the generation of the third signal (e.g., a PIM signal) when they encounter a substantially non-linear portion. In some embodiments, a PIM signal can cause a PIM radiation which will increase the overall noise level within the frequency band of interest (e.g., a cellular band) used by the transceivers and lead to dropped or distorted communication signals.

Substantially linear and substantially nonlinear media or media portions can be understood as follows. When first and second signals are induced in the media or media portion(s) and a modulation signal, or at least one intermodulation signal, is generated in the substantially nonlinear medium or medium portion from the first and second signals (e.g., based on a nonlinear interaction between the first and second signals) in the first passive substantially nonlinear medium or medium portion, any intermodulation signal generated in the substantially linear medium from the first and second signals (e.g., based on a nonlinear interaction between the first and second signals) has an amplitude A, and an amplitude of the intermodulation signal or at least one intermodulation signal generated in the passive substantially nonlinear medium is B, then B is greater than A by at least 2.5 dB. In some embodiments, a system includes an electrically conductive first passive substantially linear medium or medium portion and an electrically conductive first passive substantially nonlinear medium or medium portion. In some embodiments, any intermodulation signal generated in the first passive substantially linear medium or medium portion (e.g., based on a nonlinear interaction between the first and second signals) has an amplitude A, and an amplitude of the intermodulation signal or the at least one intermodulation signal generated in the first passive substantially nonlinear medium or medium portion is B, where B is greater than A by at least 3 dB, or at least 4 dB, or at least 5 dB, or at least 6 dB, or at least 8 dB, or at least 10 dB, or at least 15 dB, or at least 20 dB.

According to some aspects of the present description, a wireless communication system is provided including a transmitter configured to transmit at least first and second radio waves having respective different frequencies F1 and F2; an electrically conductive first passive substantially linear medium; an electrically conductive first passive substantially nonlinear medium disposed proximate the first passive substantially linear medium; and a first magnetic film covering at least a first portion of the first passive substantially linear medium and, in some embodiments, no more than about 20% of any electrically conductive passive substantially nonlinear medium; such that when the transmitter transmits the first and second radio waves, the first passive substantially linear and nonlinear media receive the first and second radio waves and generate first and second signals propagating therein at the respective frequencies F1 and F2. In some embodiments, at least one intermodulation signal is generated in the first passive substantially nonlinear medium from the first and second signals. The at least one intermodulation signal may be generated in the first passive substantially nonlinear medium based on a nonlinear interaction between the first and second signals. The nonlinear interaction may be a direct or indirect interaction. For example, the nonlinear action may be mediated by the first passive substantially nonlinear medium. In some embodiments, the first and second signals interact with the first passive substantially nonlinear medium to generate the at least one intermodulation signal. The at least one intermodulation signal has a frequency F3 equal to nF1+mF2, where m and n are positive or negative integers. In some embodiments, the first magnetic film reduces the generation of the at least one intermodulation signal by at least 2 dB or by an amount in a range described elsewhere. In some embodiments, the at least one intermodulation signal propagates in the substantially nonlinear medium and/or in the substantially linear medium (e.g., the at least one intermodulation signal can be generated in the substantially nonlinear medium, propagate in the substantially nonlinear medium to the substantially linear medium, and then propagate in the substantially linear medium). In some embodiments, any intermodulation signal generated in the first passive substantially linear medium from the first and second signals has an amplitude A, and an amplitude of the at least one intermodulation signal generated in the first passive substantially nonlinear medium is B, where B greater than A by at least 3 dB or by an amount described elsewhere.

According to some aspects of the present description, a wireless communication system is provided including a transmitter configured to transmit at least first and second radio waves having respective different frequencies F1 and F2; an electrically conductive first passive substantially nonlinear medium portion; and an electrically conductive first passive substantially linear medium portion disposed proximate the first passive substantially nonlinear medium portion, such that when the transmitter transmits the first and second radio waves, the first passive substantially linear medium portion receives the first and second radio waves and generates first and second signals at the respective frequencies F1 and F2. The first and second signals propagate in the first passive substantially linear medium portion toward the electrically conductive first passive substantially nonlinear medium portion along a first path. In some embodiments, an intermodulation signal (or at least one intermodulation signal or at least two intermodulation signals) is generated in the first passive substantially nonlinear medium portion from the first and second signals. In some embodiments, an intermodulation signal is generated in the first passive substantially nonlinear medium portion based on a nonlinear interaction between the first and second signals. In some embodiments, the first and second signals interact with the first passive substantially nonlinear medium portion (e.g., resulting in an indirect nonlinear interaction between the first and second signals) to generate an intermodulation signal. The intermodulation signal has a frequency F3 equal to nF1+mF2, where m and n are positive or negative integers. The wireless communication system further includes a first magnetic film covering at least a first portion of the first passive substantially linear medium portion along the first path and disposed to attenuate the generated first and second signals propagating in the first passive substantially linear medium portion more than the generated intermodulation signal in the first passive substantially nonlinear medium portion. For example, attenuating the signal(s) propagating in the first passive substantially linear medium portion can result in a substantial reduction the intermodulation signal that is generated in the first passive substantially nonlinear medium portion substantially even in cases where there is little or substantially no intermodulation signal being attenuated (e.g., absorbed) since the reduction can occur due to reduced generation of intermodulation signal rather than due to attenuating an intermodulation signal that has been generated. In some embodiments, the first magnetic film can also partially attenuate the intermodulation signal. For example, in some embodiments, the first magnetic film may also cover a portion of the first passive substantially nonlinear medium portion so that there is some attenuation of the generated intermodulation signal in the first passive substantially nonlinear medium portion. In some embodiments, any intermodulation signal generated in the first passive substantially linear medium portion from the first and second signals has an amplitude A, and an amplitude of the intermodulation signal generated in the first passive substantially nonlinear medium portion is B, where B greater than A by at least 3 dB or by an amount described elsewhere. An electrically conductive passive medium may include the electrically conductive first passive substantially nonlinear medium portion and the electrically conductive first passive substantially linear medium portion.

According to some aspects of the present description, a system for reducing passive intermodulation is provided including an electrically conductive first passive substantially linear medium configured to receive first and second radio waves having respective different frequencies F1 and F2 and generate first and second signals at the respective frequencies F1 and F2, where the first and second signals propagate in the first passive substantially linear medium toward an electrically conductive first passive substantially nonlinear medium along a first path. An electrically conductive first passive substantially linear medium may be configured to receive first and second radio waves and generate first and second signals by being made of a material (e.g., steel or other metal) capable of generating signals from received radio waves, for example. Suitable passive substantially linear media configured to receive first and second radio waves and generate first and second signals include (e.g., metallic) structural elements (e.g., an antenna mast) for supporting a transmitter. In some embodiments, an intermodulation signal (or at least one intermodulation signal or at least two intermodulation signals) is produced in the first passive substantially nonlinear medium from the first and second signals. In some embodiments, the intermodulation signal is produced in the first passive substantially nonlinear medium based on a nonlinear interaction between the first and second signals. For example, in some embodiments, the first and second signals interact with the first passive substantially nonlinear medium to produce the intermodulation signal. The intermodulation signal has a frequency F3 equal to nF1+mF2, where m and n positive or negative integers. The system includes a first magnetic film covering at least a first of the first passive substantially linear medium along the first path. In some embodiments, the first magnetic film covers no more than about 20% of the first passive substantially nonlinear medium or no more than about 20% of any passive substantially nonlinear medium. In some embodiments, the first magnetic film covers a first portion of the first passive substantially linear medium along the first path leaving exposed a second portion of the first passive substantially linear medium, where the first magnetic film faces the first passive substantially nonlinear medium and the second portion faces away from the first passive substantially nonlinear medium. In some embodiments, the first magnetic film reduces the intermodulation signal by at least 2 dB or by an amount in a range described elsewhere. In some embodiments, any intermodulation signal produced in the first passive substantially linear medium from the first and second signals has an amplitude A, and an amplitude of the intermodulation signal produced in the first passive substantially nonlinear medium is B, where B greater than A by at least 3 dB or by an amount described elsewhere.

Turning now to the figures, FIG. 1 is a side view of a wireless communication system, according to some embodiments of the present description. In some embodiments, a wireless communications system 200 includes one or more antennas 50 disposed on (e.g., mounted on and supported by) an electrically-conductive passive medium 10 (e.g., a metallic antenna mast or mounting structure). In some embodiments, the electrically-conductive passive medium 10 may include two different portions, an electrically-conductive passive linear portion 11 (e.g., a primary, substantially heterogeneous element, such as a main shaft, of the mounting structure) and an electrically-conductive passive nonlinear portion 12 (e.g., a mounting bracket, weld bead, or other connecting structure). It should be noted that nonlinear portion 12 may be created by the presence of a different material and/or disparate condition relative to the linear portion 11. That is, a nonlinear element may be created at the interface between two different metals (e.g., the galvanized steel of an antenna mast and the metal used in a mounting bracket attached to the mast), from a loose or corrupted connector point or cable, from rust, corrosion, dirt, oxidation, etc., from nearby metallic objects such as roof flashing or pipes, or from any of a number of other causes. For the purposes of illustration, the nonlinear element 12 is shown in FIG. 1 coincident with a mounting bracket for an antenna, but may in reality be any appropriate nonlinearity of any appropriate cause or condition.

In some embodiments, wireless communications system 200 may also include one or more transceivers 60 (e.g., transceivers housed in a base transceiver station for a cellular base station) coupled to the antennas 50. In some embodiments, transceivers 60 may be used to facilitate wireless communication between external devices and the wireless network. In some embodiments, transceivers 60 may be high-power transceivers (e.g., 20W or greater).

Figure 2:
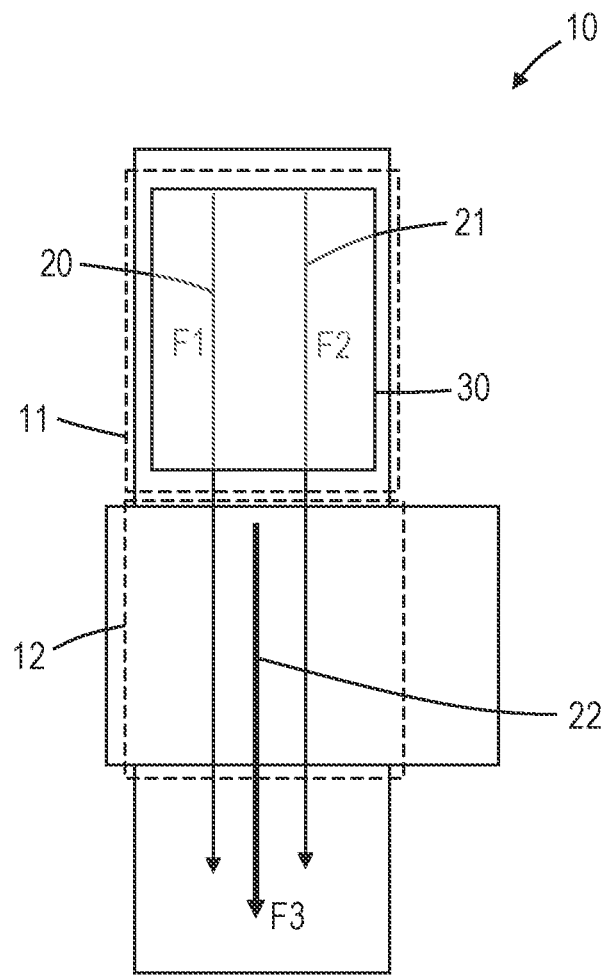
FIG. 2 is a schematic side view of an electrically conductive passive medium capable of propagating signals in a wireless communication system, in accordance with an embodiment of the present description.

In operation, in some embodiments, the transceivers 60 of the wireless communication system 200 may generate two or more radio frequency (RF) signals, each at a unique frequency. The signals propagate through a transmission line (e.g., a coaxial cable, or a fiber optic) to be broadcast/radiated from antennas 50 (e.g., a first antenna 50a) as electromagnetic radiation 40. In some embodiments, electromagnetic radiation 40 may include electromagnetic first waves 40a, radiating at frequency F1, and electromagnetic second waves 40b, radiating at frequency F2. In some embodiments, when electromagnetic first waves 40a and electromagnetic second waves 40b impinge upon the structure comprising the linear and nonlinear portions 11 and 12, respectively, first waves 40a and second waves 40b may induce first signal 20 and second signal 21, respectively, within the nonlinear portion 12 at corresponding frequencies F1 and F2 (first signal 20 and second signal 21 are shown in FIG. 2). In some embodiments, nonlinear portion 12 may act as a mixer, combining first signal 20 and second signal 21 to produce a third signal (i.e., an intermodulation signal) 22 at a third frequency F3. Third signal 22 (as well as first signal 20 and second signal 21) may then propagate throughout electrically-conductive passive medium 10 (e.g., follow the path of the metallic antenna mast) possibly flowing back into transceiver 60, or into one or more antennas 50, or reradiating into space at new frequency F3 as second electromagnetic radiation 41, and thereby back to one or more antennas, 50. In some embodiments, a second antenna 50b may re-transmit or receive RF signals originally generated at first antenna 50a (with fundamental frequencies F1 and F2), including PIM signals at frequency F3 created within one or more nonlinearities 12/12a). These RF signals (and in particular the F3 signal) may be seen as increased noise at transceiver 60, greatly reducing the SNR of the intended signals.

To mitigate the effects of PIM, one or more magnetic films 30 (in some embodiments, including 30a and 30b) may be disposed on or near an electrically conductive external surface 13 of linear medium portion 11. In some embodiments, magnetic film 30 may reduce or prevent the generation of the intermodulation signal 22 in the nonlinear portion 12. In some embodiments, intermodulation signal 22 may be reduced by the magnetic film 30 in a number of ways. In some embodiments, magnetic film 30 may attenuate one or both of the first and second signals before they enter the nonlinear portion 12, such that the intermodulation signal 22 is not generated, or is reduced significantly. In some embodiments, magnetic film 30 may intercept signals or radiated energy from nonlinear portion 12 as it exits nonlinear portion 12 before entering into linear portion 11/11a/11b. In some embodiments, additional magnetic films 30 (such as films 30a and/or 30b) may be disposed on or proximate to additional linear portions 11 (such as portions 11a and/or 11b) to help attenuate signals induced in or passing through the structures. In some embodiments, for example, a magnetic film 30 (e.g., a magnetic absorber) may be placed on the linear portions 11 on either side of a nonlinear portion 12, such that signals generated in or otherwise exiting nonlinear portion 12 are attenuated and/or eliminated.

FIG. 2 is a side view of the electrically conductive passive medium 10 of FIG. 1, showing additional detail regarding the creation of an intermodulation signal. Electromagnetic radiation (RF signals) broadcast by a nearby antenna or radiated by another conducting structure (as shown in FIG. 1) induce a first signal 20 (corresponding to an RF signal with fundamental frequency F1) and a second signal 21 (corresponding to an RF signal with fundamental frequency F2) within an electrically-conductive passive medium 10 (e.g., a metallic portion of an antenna mast). In some embodiments, first signal 20 and second signal 21 may be induced within an electrically-conductive passive linear portion 11 of electrically-conductive passive medium 10, and then travel throughout other portions of the structure. In these embodiments, first signal 20 and second signal 21 may propagate through electrically-conductive passive linear portion 11 until they encounter an electrically-conductive passive nonlinear portion 12. As described elsewhere herein, nonlinear portion 12 may be created by a number of things, including but not limited to a junction between disparate materials, a loose connection between mechanical parts, an area of corrosion or damage, the proximity of other electrically-conductive components (e.g., pipes or roof flashing), etc. As first signal 20 and second signal 21 enter nonlinear portion 12, the nonlinearity may cause the first signal 20 and second signal 21 to mix, generating new signals with new frequencies. In some embodiments, at least a third signal 22 is generated, which has a frequency F3 which may represent, for example, a third order harmonic of F1 and F2, which may be calculated using the formula F3=nF1+mF2, where n and m may be positive or negative integers. Stated another way, the third signal may be an intermodulation signal which has a frequency F3 that may cause the intermodulation signal to, when radiated from an antenna or other structure, be received by antenna 50 in the frequency region intended for reception of signal from an external device (e.g., a mobile device, such as a cellular phone), thereby raising the noise level and reducing the fidelity of the received signal. This will in turn reduce the rate at which information can be transferred from the mobile device to the antenna, 50, or may cause the connection from the mobile device to the antenna to be lost (i.e., a "dropped call"). In other embodiments, first signal 20 and second signal 21 may be induced directly in the nonlinear portion 12 (rather than originating in the linear portion 11 and propagating into the nonlinear portion 12). In these embodiments, each of the signals 20 and 21, as well as the intermodulation signal 22, may propagate out of and away from nonlinear portion 12 and into an adjacent linear portion 11.

In some embodiments, a magnetic film 30 may be disposed on (e.g., placed on an external surface or wrapped around) the linear portion 11 of electrically-conductive passive medium 10 adjacent to a nonlinear portion 12. In some embodiments, the magnetic film 30 may be a magnetic absorber which at least partially attenuates the first signal 20 and second signal 21 (through absorption of the magnetic fields they produce adjacent to the linear section), as well as at least a portion of any electromagnetic fields created by signal 20 and 21, before they enter the nonlinear portion 12. By reducing or eliminating the first signal 20 and the second signal 21 before they enter the nonlinear portion 12, the creation of the third (intermodulation) signal 22 may be prevented or significantly reduced. In some embodiments, when the first signal 20 and second signal 21 are first generated within the nonlinear portion 12, the magnetic film 30 may limit or eliminate any signals (e.g., electric currents) attempting to exit the nonlinear portion 12, including first signal 20, second signal 21, and third signal 22.

Figure 3:
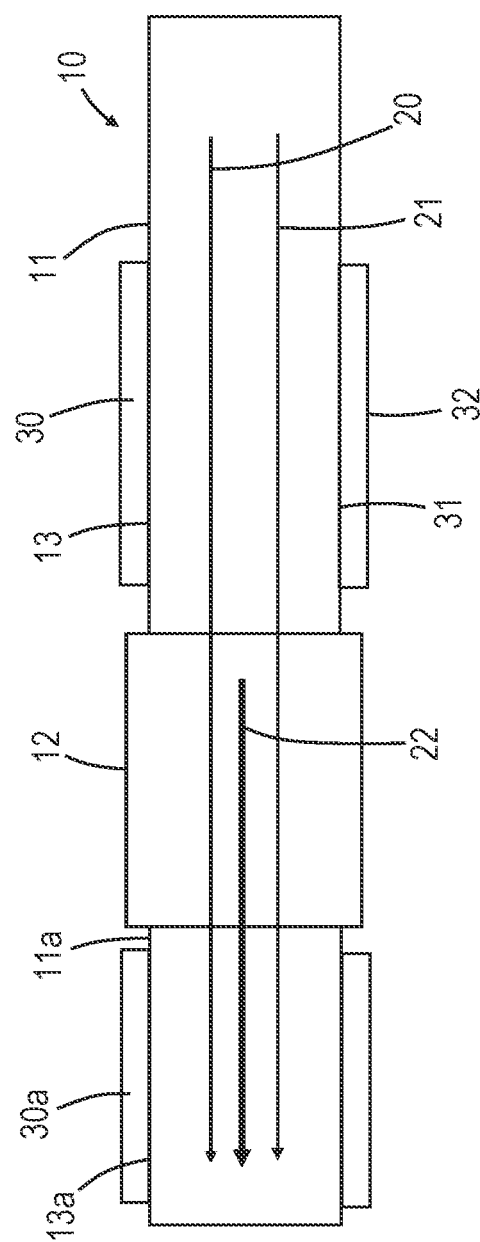
FIG. 3 is a schematic side view of an electrically conductive passive medium with magnetic absorbing films, in accordance with an embodiment of the present description.

In some embodiments, two or more magnetic films 30 may be disposed on multiple linear portions 11 (e.g., the shaft of an antenna mast that extends both above and below a nonlinear portion such as a mounting bracket) to prevent or reduce PIM signals that may be generated within nonlinear portion 12 from propagating throughout other portions of electrically-conductive passive medium 10. FIG. 3 provides a side, cut-away view of an electrically conductive passive medium 10 with magnetic absorbing films, in accordance with an embodiment of the present description. In the embodiments shown, the electrically conductive passive medium 10 includes an electrically conductive first passive linear medium portion 11 (or "first linear portion") and an electrically conductive second passive linear portion 11a (or "second linear portion"), both of which are adjacent the electrically conductive first passive nonlinear medium portion 12 (or "nonlinear portion"). That is, the first linear portion 11 and the second linear portion 11a are disposed on either side of the nonlinear portion 12. A first magnetic film 30 is disposed proximate to an electrically conductive external surface 13 of first linear portion 11 (e.g., wrapped around first linear portion 11), and a second magnetic film 30a is disposed proximate to an electrically conductive external surface 13a of second linear portion 11a. In some embodiments, at least one of the first and second magnetic films 30, 30a substantially conforms to at least a portion of the respective external surface 13, 13a. In some embodiments, first induced signal 20 and second induced signal 21 propagate along first linear portion 11 and enter nonlinear portion 12. Once entering nonlinear portion 12, the first signal 20 and second signal 21 may mix to create a third or intermodulation signal 22, which may then propagate out of nonlinear portion 12 as a surface wave. By placing the first magnetic film 30 and second magnetic film 30a on either side of the nonlinear portion (i.e., disposed on first and second linear portions 11 and 11a), the magnetic films 30 and 30a may absorb any electrical signals either trying to enter the nonlinear portion 12 (where they may mix to create new signals at new frequencies) or trying to exit the nonlinear portion 12. By absorbing these signals (including any PIM signals created), and by additionally absorbing or preventing the formation of electromagnetic fields due to the signals, the magnetic films 30 and 30a can eliminate or significantly reduce PIM interference.

Figure 4:
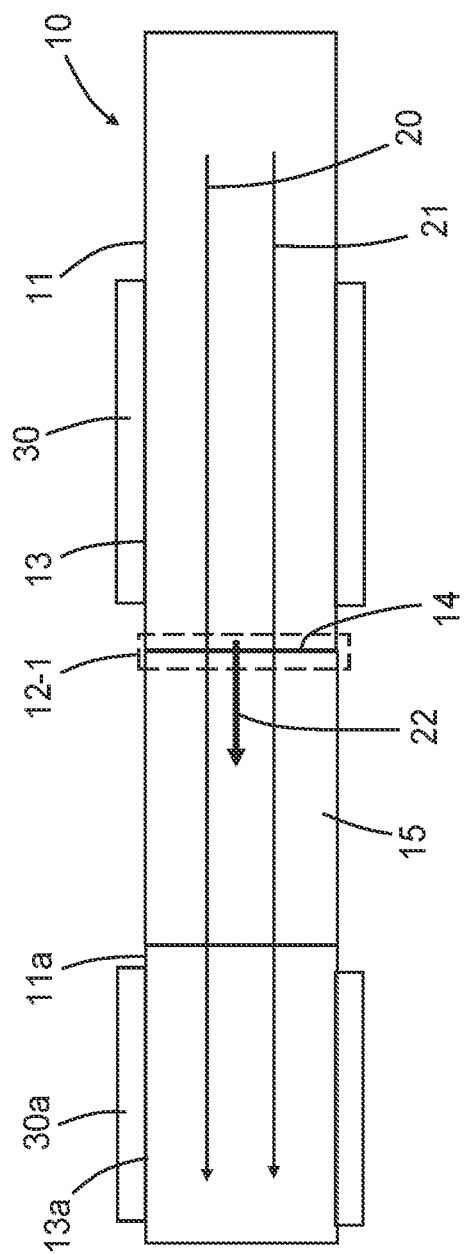
FIG. 4 is a schematic side view of an electrically conductive passive medium illustrating a junction between a first and second electrically conductive portions, in accordance with an embodiment of the present description.
Figure 5:
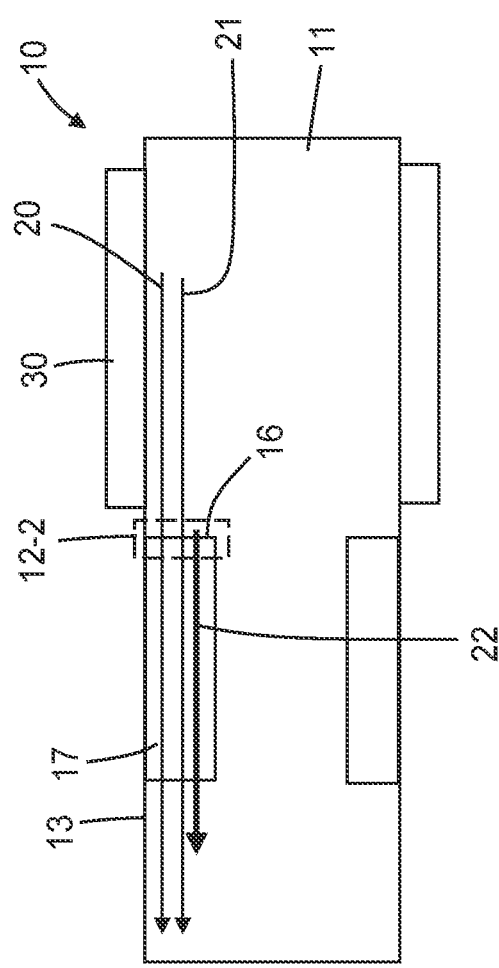
FIG. 5 is a schematic side view of an electrically conductive passive medium illustrating a junction between a metal and a metal oxide, in accordance with an alternate embodiment of the present description.
Figure 6:
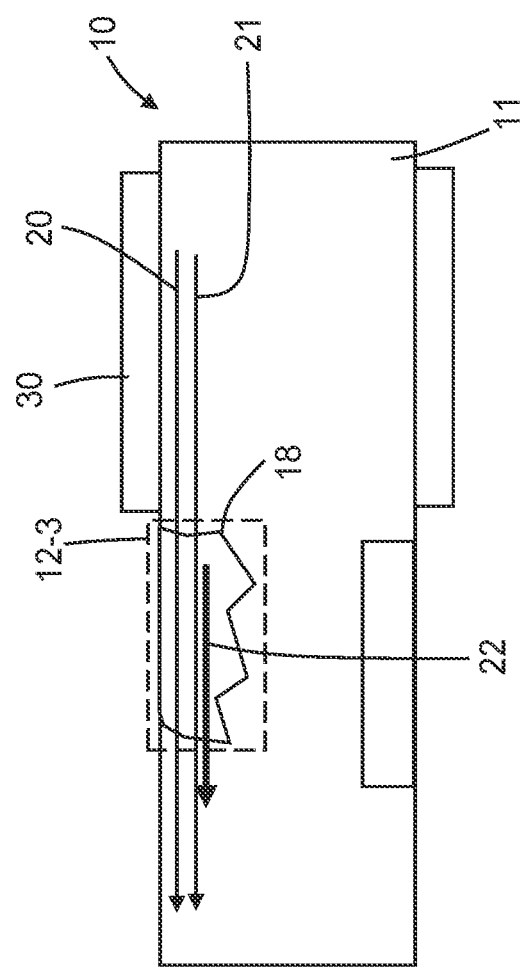
FIG. 6 is a schematic side view of an electrically conductive passive medium illustrating metal corrosion, in accordance with an alternate embodiment of the present description.

The example nonlinearity (i.e., nonlinear portion 12) shown in FIG. 3 may be created by a mounting bracket or mounting hardware which is of a sufficiently different material than electrically-conductive passive medium 10, or which is loosely connected to electrically-conductive passive medium 10, such that the disparity leads to the nonlinear component. In another example, the nonlinearity may be a rusted bolt or other fastener connecting two portions of electrically conductive passive medium 10, or of a material sufficiently different than passive medium 10. FIGS. 4, 5, and 6 provide side, cutaway views of similar embodiments of a wireless communication system, in which various components and/or conditions create a nonlinearity, potentially leading to the creation of PIM interference, according to descriptions herein. FIGS. 4, 5, and 6 each contain like-numbered elements in common with those of FIG. 3, and which serve similar functions. Like-numbered elements which have already been described in regard to FIG. 3 may not be discussed again for FIGS. 4, 5, and 6, except as required.

In some embodiments, the magnetic film(s) are electrically nonconductive. In some such embodiments, or in other embodiments, a magnetic film (e.g., first magnetic film 30) includes a first major surface (e.g., major surface 31) contacting a first portion of the first passive substantially linear medium and an at least partially exposed opposite second major surface (e.g., major surface 32). Greater than 50% by area, for example of the second major surface may be exposed (e.g., not covered by an additional layer such as an electrically conductive layer).

FIG. 4 is a side, cutaway view of electrically conductive passive medium 10, in which a nonlinearity 12-1 is created by a junction 14 between a first metal 11 and a second different metal 15. For example, the area of surface contact between a first metal 11 and second different metal 15 may have different electrochemical potential, creating a nonlinear I/V curve (non-linear junction). The use of one or more magnetic films 30/30a disposed on external surfaces 13/13a adjacent the nonlinearity 12-1 can absorb/mitigate the induced signals propagating to and intermodulation signals propagating away from this non-linear junction, which can contribute to the creation of PIM effects.

FIG. 5 is a side view of an electrically conductive passive medium 10, in which a nonlinearity 12-2 is created by a junction between a metal 11 and a metal oxide 17. For example, in some embodiments, an ionic chemical reaction may occur on the surface of an exposed metal when oxygen is present, causing electrons from the metal to move to the oxygen molecules, creating negative oxygen ions which can create an oxide surface on the metal. The interface between the original metal and created metal oxide can be a source of PIM. Disposing one or more magnetic films 30 adjacent to the nonlinearity 12-2 can help mitigate the creation of PIM distortion, as described herein.

FIG. 6 is a side view of an electrically conductive passive medium 10, in which a nonlinearity 12-3 is created by a region of rust 18 on the electrically conductive passive medium 10. Other conditions which can create nonlinearities, include but are not limited to contaminants (e.g., a dirty connection), a loose connection, irregular metal-to-metal contact (e.g., a bad weld bead), and uneven contact surfaces. Disposing one or more magnetic films 30 adjacent to the nonlinearity 12-3 can help mitigate the creation of PIM distortion, as described herein.

FIG. 7 is a graph that illustrates the frequencies of transmission signals and intermodulation signals in a wireless communication system, as described in the current description. The y-axis indicates the relative amplitude (strength) of the signals, and the x-axis shows relative frequency bands of the signals. In the center of the graph, the transmit or Tx band includes (in this example) the two intended signals for transmission, which are labeled based on their corresponding frequency, F1 and F2, as described elsewhere herein. Moving out in either direction from the Tx band signals are the odd numbered passive intermodulation signals that may be generated by the mixing of the Tx band signals. Moving to the left of the page from the F1 signal are the third-order intermodulation, fifth-order intermodulation, seventh-order intermodulation, and so on. Moving to the right of the page from the F2 signal are the alternate third-order intermodulation, fifth-order intermodulation, seventh-order intermodulation, and so on. For example, the signal immediately to the left of the F1 signal is the third-order passive intermodulation radiation (PIM) produced by the formula $nF1+mF2$ when $n=+2$ and $m=-1$ (i.e., $2F1-F2$). As is seen in FIG. 7, this third-order intermodulation falls into one of the intended receive or Rx bands in use by the wireless communication system, and the amplitude of the signal is still relatively high. These types of PIM signals may interfere with the reception of intended, legitimate signals by raising the level of noise and reducing the signal-to-noise ratio (SNR) of the signals. The use of magnetic absorbers as described herein can help mitigate the creation of these PIM distortion signals and improve the SNR of the intended wireless system signals.

Figure 8A:
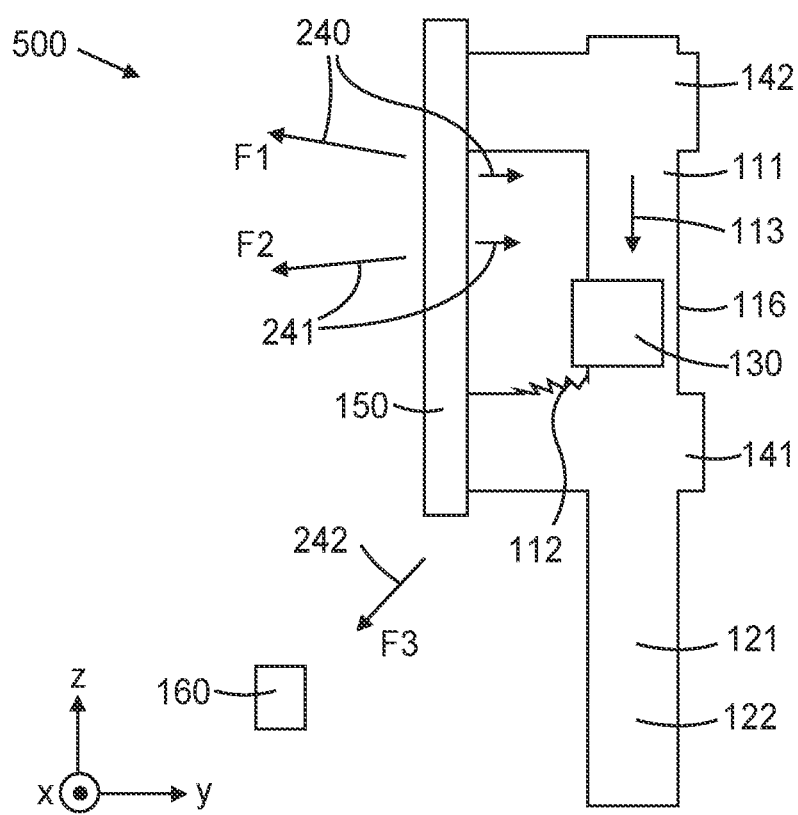
FIGS. 8A-8F are schematic illustrations of systems for reducing passive modulation, in accordance with some embodiments of the present description.
Figure 8B:
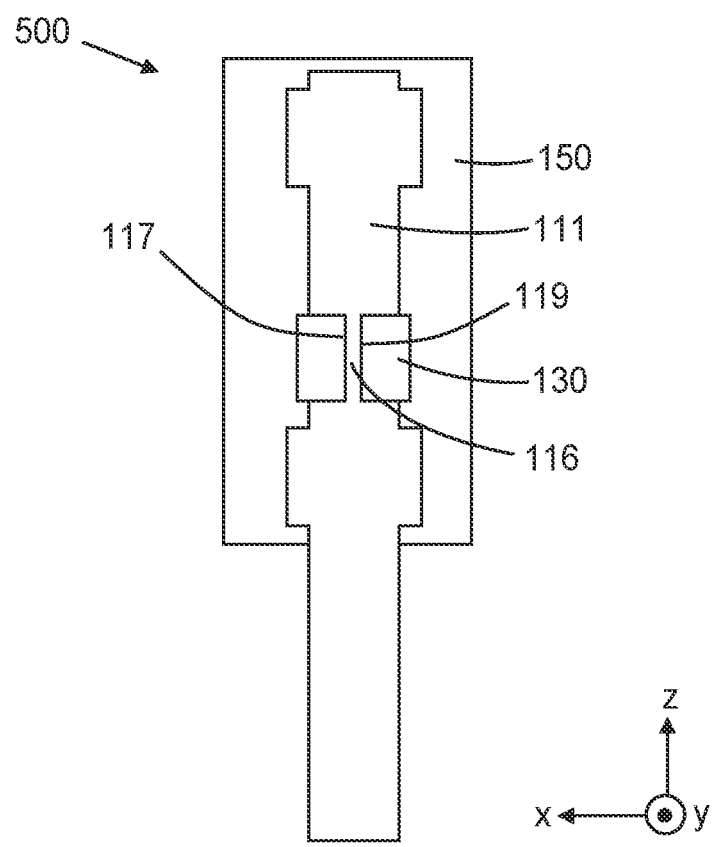

FIGS. 8A-8F are schematic illustrations of wireless communication systems, in accordance with some embodiments of the present description. The wireless communication system 500, 500', 500", 500''', 500'''' includes a transmitter 150 (e.g., an antenna), an electrically conductive first passive substantially linear medium 111 (which may also be referred to as an electrically conductive first passive substantially linear medium portion), an electrically conductive first passive substantially nonlinear medium 112 (which may also be referred to as an electrically conductive first passive substantially nonlinear medium portion) disposed proximate the first passive substantially linear medium 111, and a first magnetic film 130, 130', 130", 131, 130''', 130'''' covering at least a first portion of the first passive substantially linear medium 111 and no more than about 20% of any electrically conductive passive substantially nonlinear medium. The wireless communication system 500, 500', 500", 500''', 500'''', or the system without the transmitter 150, may be referred to as a system for reducing passive intermodulation. In some embodiments, the first magnetic film (e.g., 130, 130', 130", 131, 130''', 130'''') substantially conforms (e.g., nominally conforms, or conforms up to variations on a scale of no more than about three times the thickness of the magnetic film, or conforms up to variations on a scale of no more than about 20% or about 10% of a largest dimension or a diameter of the first portion) to the at least first portion of the first passive substantially linear medium. FIG. 8A is a schematic side view of the wireless communication system 500 and FIG. 8B is a schematic rear view of the wireless communication system 500. FIGS. 8C-8F are schematic rear views of the wireless communication systems 500', 500", 500''', 500'''', respectively, which correspond to the wireless communication system 500 except for the placement of magnetic film(s). In some embodiments, the first passive substantially linear medium 111 is a portion of a support structure 122 for supporting the transmitter 150 and the first passive substantially nonlinear medium 112 is attached to the support structure 122. In the illustrated embodiment, the support structure 122 is or includes an antenna mast 121 so that the first passive substantially linear medium 111 is a portion of the antenna mast 121 and the first passive substantially nonlinear medium 112 is attached to the antenna mast 121. In other embodiments, the support structure may be other structures in a cellular base station, for example, used to support an antenna, for example. In the illustrated embodiment, the transmitter 150 is mounted to an antenna mast 121 through first and second mounting brackets 141 and 142. In other embodiments, a single mounting bracket may be used, or more than two mounting brackets may be used. One or more of the mounting brackets may be a substantially nonlinear medium, or a junction between the mast 121 and one or more of the mounting brackets may be a substantially nonlinear medium, or rust (schematically depicted in FIG. 8A on mounting bracket 141) on one or more of the mounting brackets or on the antenna mast 121 adjacent one or more of the antenna masts may be a substantially nonlinear medium 112.

In some embodiments, the first magnetic film at least partially wraps around the first passive substantially linear medium. In the embodiment of FIGS. 8A-8B, the first magnetic film 130 only partially wraps around the first passive substantially linear medium 111. In some embodiments, an electrically conductive first passive substantially linear medium 111 is configured to receive first and second radio waves (e.g., corresponding to radiation 40, 41) having respective different frequencies F1 and F2 and generate first and second signals (e.g., corresponding to signals 20, 21) at the respective frequencies F1 and F2, the first and second signals propagating in the first passive substantially linear medium 111 toward an electrically conductive first passive substantially nonlinear medium 112 along a first path 113. In some embodiments, a first magnetic film 130 covers a first portion of the first passive substantially linear medium 111 along the first path 113 and leaves exposed a second portion 116 of the first passive substantially linear medium 111, where the first magnetic film 130 faces the first passive substantially nonlinear medium 112 and the second portion 116 faces away from the first passive substantially nonlinear medium 112. In some embodiments, the first magnetic film 130 only partially wraps around the first passive substantially linear medium 111 leaving a portion 116 of the passive substantially linear medium exposed between opposite ends 117 and 119 of the first magnetic film 130, where the exposed portion 116 faces away from the first passive substantially nonlinear medium 112.

Figure 8C:
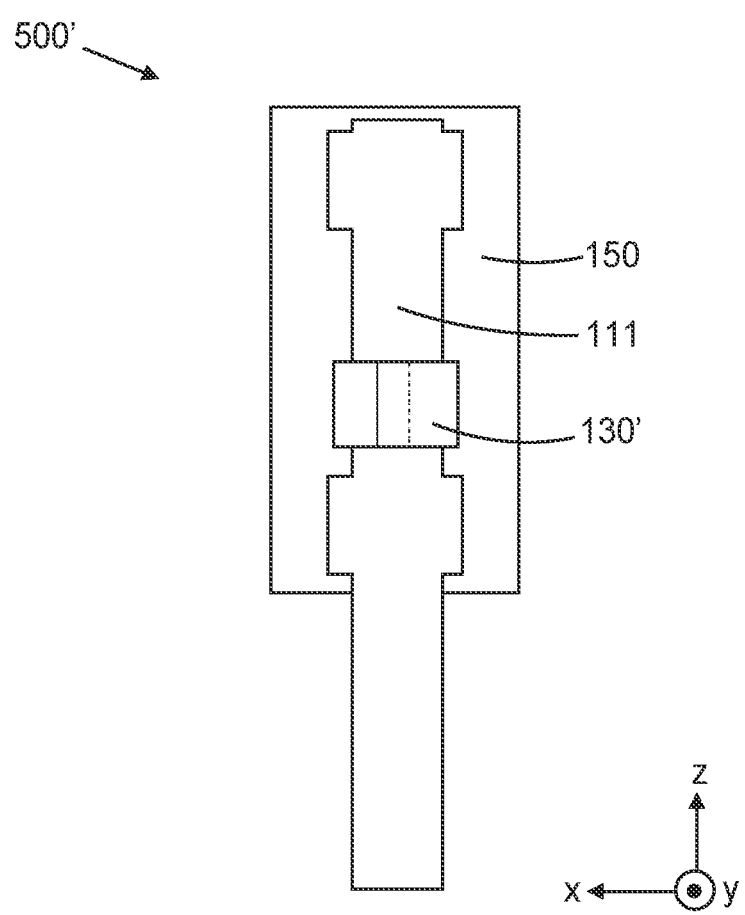
Figure 8D:
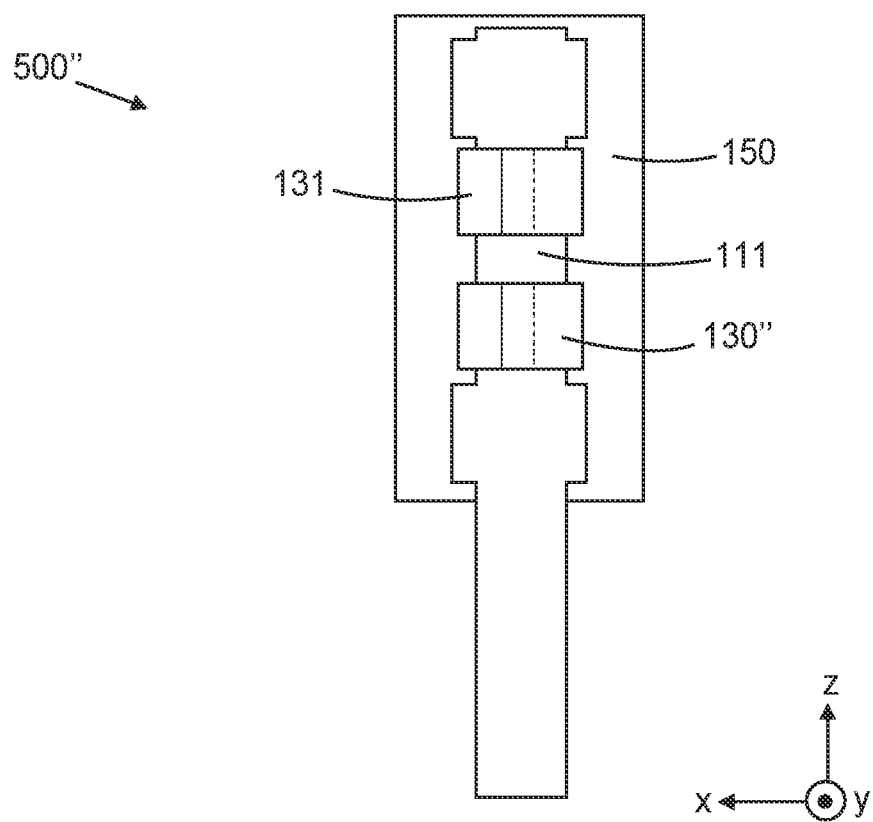
Figure 8E:
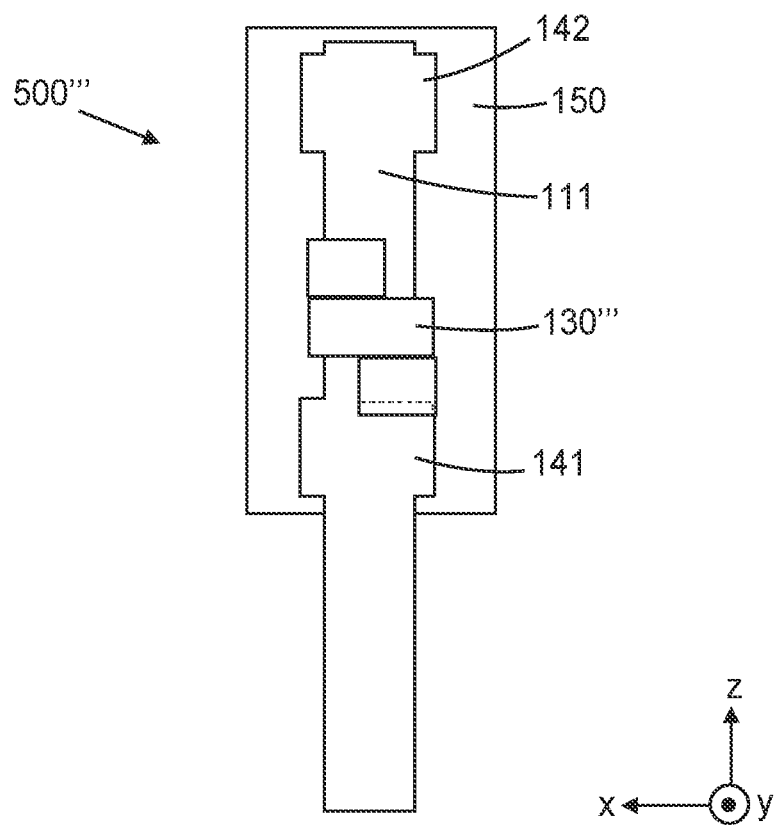
Figure 8F:
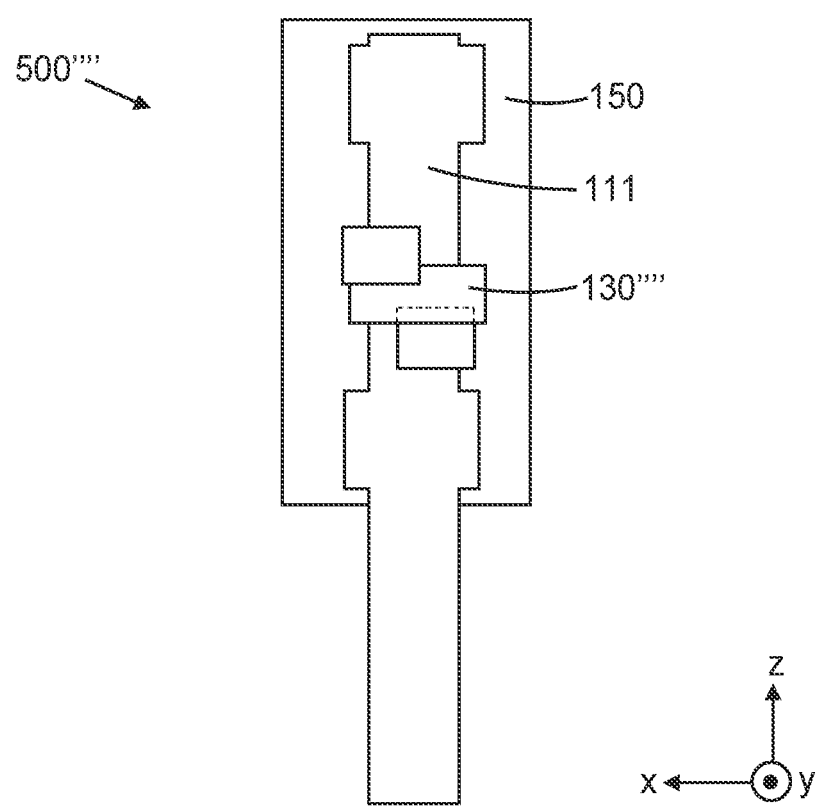

In the embodiment of FIG. 8C, the first magnetic film 130' fully wraps around the first passive substantially linear medium 111. In the illustrated embodiment, ends of the magnetic film 130' overlap one another. In some embodiments, a system 500" includes a first magnetic film 130" and further includes a second magnetic film 131 covering at least a second portion of the first passive substantially linear medium 111 and no more than about 20% of any electrically conductive passive substantially nonlinear medium. In the embodiments illustrated in FIGS. 8E-8F, the first magnetic film 130''', 130'''' helically wraps around the first passive substantially linear medium. In some embodiments, the first magnetic film 130''' helically and non-overlappingly wraps around the first passive substantially linear medium. The magnetic film 130''' may helically and non-overlappingly wrap around the first passive substantially linear medium 111 with or without gaps between adjacent wraps. It has been found that having no gaps between adjacent wraps that face a substantially nonlinear medium 112 results improved reduction in the intermodulation signal(s). In some embodiments, the first magnetic film 130'''' helically and overlappingly wraps around the first passive substantially linear medium 111. In the embodiment illustrated in FIG. 8E, the first magnetic film 130''' covers a portion of the mounting bracket 141 which may be a substantially non-linear medium. However, in some embodiments, the first magnetic film 130''' covers no more than about 20% of the mounting bracket 141. In some embodiments, the first magnetic film 130''' (or magnetic films 130', 130", 130''', 131) covers at least a first portion of the first passive substantially linear medium or medium portion along the first path 113 and is disposed to attenuate the generated first and second signals propagating in the first passive substantially linear medium or medium portion more than the generated intermodulation signal in the first passive substantially nonlinear medium or medium portion.

As described further elsewhere herein, the transmitter 150 is configured to transmit at least first and second radio waves 240 and 241 having respective different frequencies F1 and F2, such that when the transmitter 150 transmits the first and second radio waves 240 and 241, the first passive substantially linear and nonlinear media or media portions receive the first and second radio waves 240 and 241 and generate first and second signals (e.g., corresponding to signals 20, 21) propagating therein at the respective frequencies F1 and F2. An intermodulation signal (e.g., corresponding to signal 22), or at least one intermodulation signal, is generated in the first passive substantially nonlinear medium or medium portion from the first and second signals. The intermodulation signal, or the at least one intermodulation signal, has a frequency F3 equal to nF1+mF2, where m and n are positive or negative integers. In some embodiments, the first magnetic film reduces the generation of the intermodulation signal, or the at least one intermodulation signal, by at least 2 dB, or at least 3 dB, or at least 3.5 dB, or at least 4 dB, or at least 5 dB, or at least 6 dB (e.g., 2 dB to 100 dB or 3 to 50 dB). In some embodiments, at least first and second intermodulation signals are generated or produced in first passive substantially nonlinear medium or medium portion from the first and second signals. The first and second intermodulation signals have respective different frequencies F3 and F3'. Each of F3 and F3' is equal to nF1+mF2, where m and n are positive or negative integers. For example, the first intermodulation signal can correspond to one of the PIM signals schematically indicated in FIG. 7 (e.g., the signal having the frequency 2F1-F2) and the second intermodulation signal can correspond to a different one of the PIM signals schematically indicated in FIG. 7 (e.g., the signal having the frequency 3F1-2F2 or the signal having the frequency 2F2-F1). In some embodiments, the first magnetic film reduces each of the first and second intermodulation signals by at least 2 dB, or at least 3 dB, or at least 3.5 dB, or at least 4 dB, or at least 5 dB, or at least 6 dB (e.g., 2 dB to 100 dB or 3 dB to 50 dB).

In some embodiments, the system 500, 500', 500", 500''', 500'''' may include a receiver 160, such that when the intermodulation signal (e.g., corresponding to signal 22), or the at least one intermodulation signal, is generated or produced in the first passive substantially nonlinear medium 112, the intermodulation signal, or the at least one intermodulation signal, radiates a radio wave 242 at the frequency F3, and the receiver 160 detects the radiated radio wave 242. In some embodiments, the first magnetic film (e.g., 130, 130', 130", 130''', 130'''', 131), or a combination of one or more magnetic films (e.g., 130" and 131), reduces the radiated radio wave detected by the receiver by at least 2 dB. In some embodiments, the magnetic film(s) reduce the radiated radio wave detected by the receiver by at least 3 dB, or at least 3.5 dB, or at least 4 dB, or at least 5 dB, or at least 6 dB (e.g., 3 dB to 100 dB or 3.5 dB to 50 dB).

Figure 9:
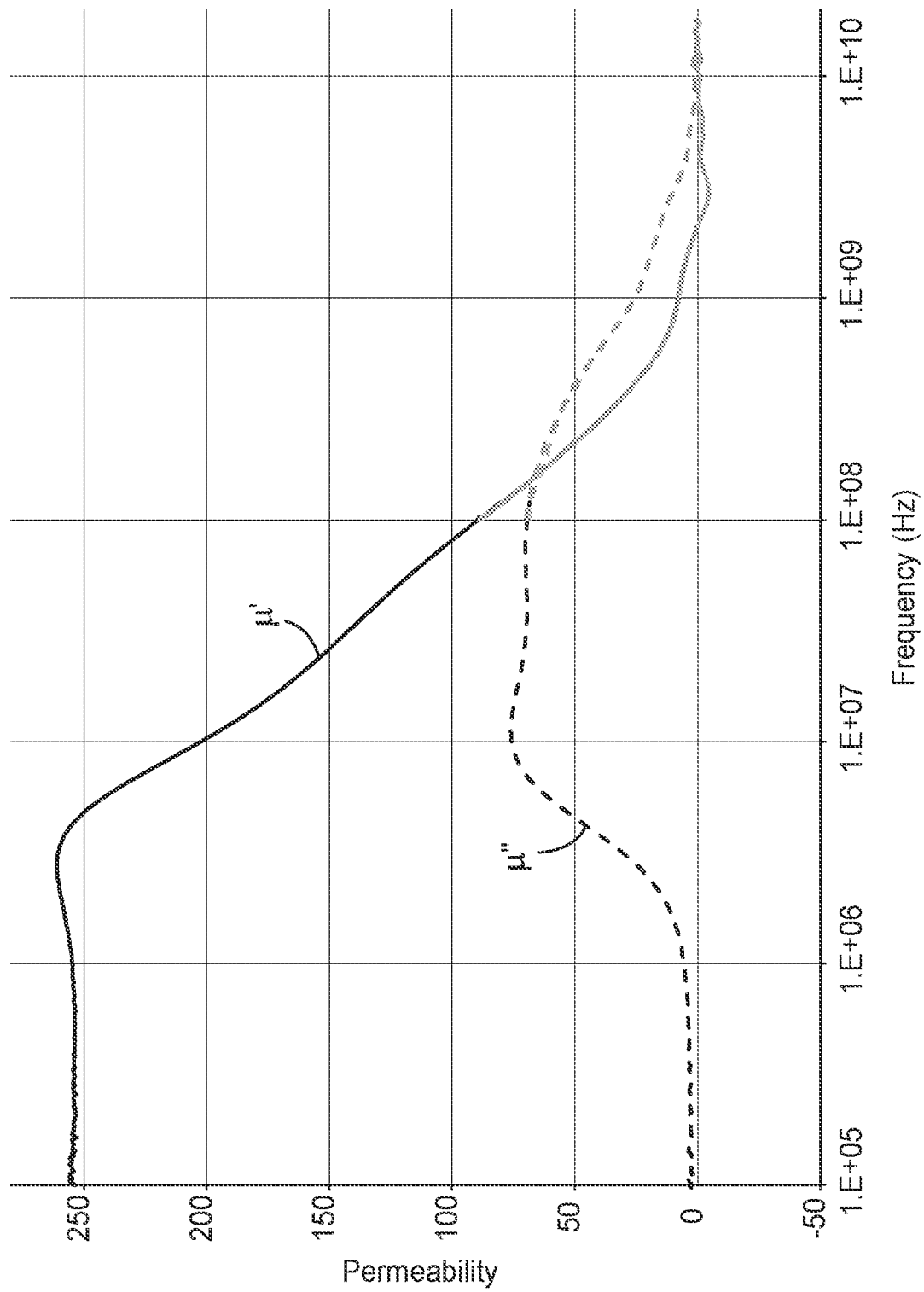
FIGS. 9-10 are plots of permeability versus frequency for magnetic films, in accordance with some embodiments of the present description.
Figure 10:
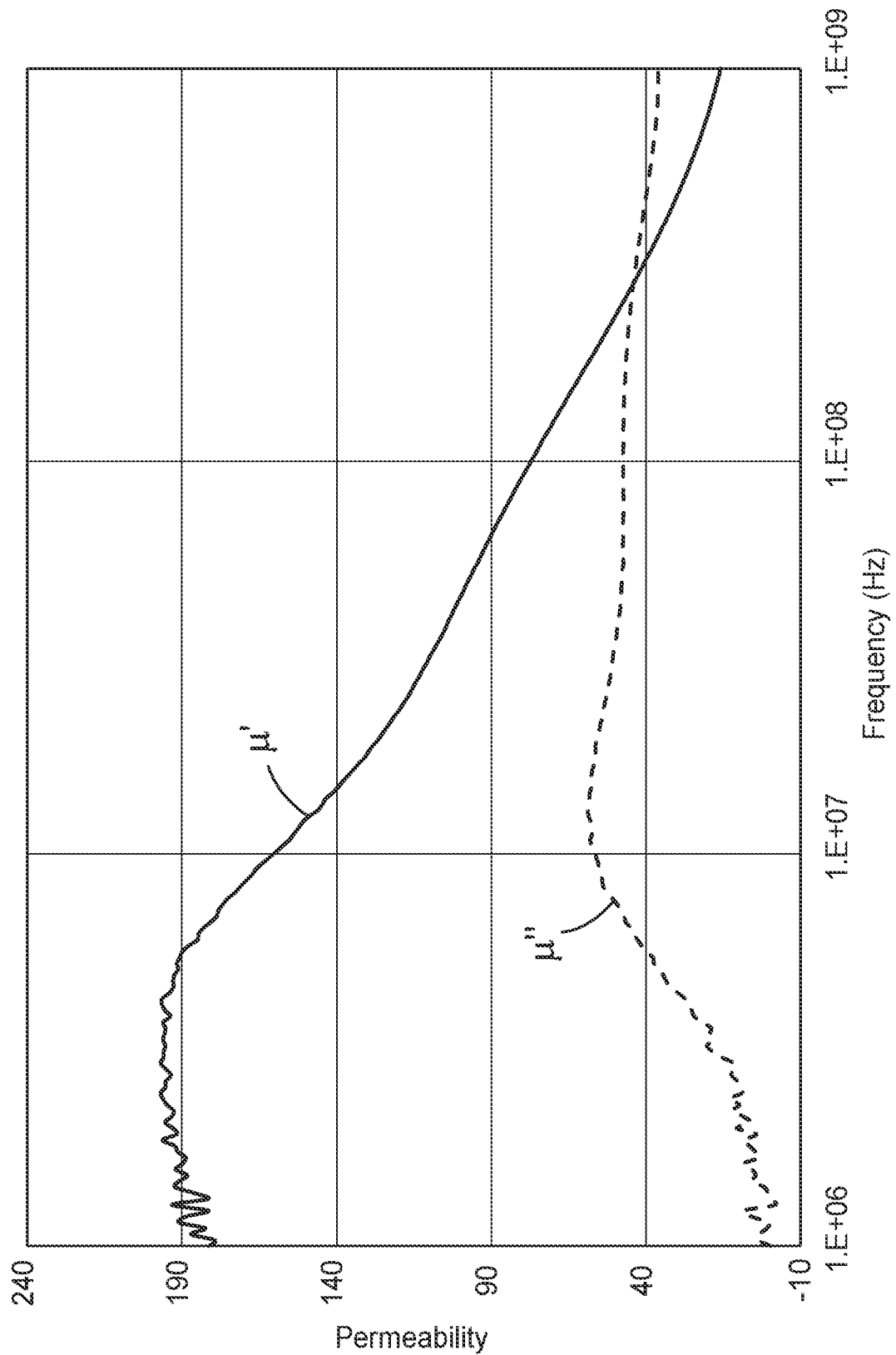

FIGS. 9-10 are plots of permeability versus frequency for various magnetic films. FIG. 9 shows the permeability for 3M™ Flux Field Direction Material (FFDM) EM25TP-0100 (which has a 100 micrometer thick composite magnetic FFDM layer). FIG. 10 shows the permeability for a related magnetic film including a magnetic absorber layer with magnetic filler in a carrier resin. The real ($\mu'$) and imaginary ($\mu''$) parts of the permeability are shown. In some embodiments, the magnetic film has a relative permeability having an imaginary part of at least about 5, or at least about 10, or at least about 15, or at least about 20 for at least one of F1 or F2. In some such embodiments or in other embodiments, the magnetic film has a relative permeability having an imaginary part of at least about 5, or at least about 10, or at least about 15, or at least about 20 for F3. In some embodiments, the relative permeability has an imaginary part of at least about 5, or at least about 10, or at least about 15, or at least about 20 for each of F1, F2, and F3. In some embodiments, the magnetic film includes a magnetic absorber layer having an average thickness in a range of about 25 micrometers to about 1 mm or in a range of about 40 micrometers to about 500 micrometers. In some embodiments, a thinner absorber layer may be used when the absorber layer has a high u" (e.g., at least about 10) and/or magnetic loss tangent (e.g., $\mu''/\mu'$ at least about 2) at F1 and/or F2, and a thicker absorber layer may be used when the u" and/or magnetic loss tangent of the layer is lower.

Examples

A wireless communication system including an antenna (COMMSCOPE LNX-6513DS-A1M, available from CommScope, Inc., Hickory, NC) mounted to an antenna mast (galvanized steel pole) with clamps at two mounting brackets (see, e.g., FIGS. 8A-8E) was disposed in an anechoic chamber. The antenna was about 4.5 feet tall and the antenna mast had an outer diameter of about 2 inches. The antenna was disposed to radiate primarily away from the antenna mast. A PIM analyzer (SummiTek iQA850B, available from Kaelus, Spokane Valley, WA) was attached to a port of the antenna with a coaxial cable. Two 43 dBm (20 W) continuous wave (CW) carriers at 871 MHz and 894 MHz were input to a single port of the antenna and the reflected PIM signal at 848 MHz (2*871 MHz-894 MHz) was measured by the PIM analyzer through the same port. With no external PIM source, the PIM analyzer reported a PIM signal of −126.9 dBm, which is equivalent to −169.9 dBc for an input power of 43 dBm, indicating a low noise floor that was stable over at least 5 minutes. Experiments carried out using magnetic film(s) included placing PIM source(s) (e.g., steel wool), applying the magnetic film(s), and then removing the magnetic film(s) thus reestablishing a baseline for the case where no magnetic film(s) were present. This procedure ensured that the PIM source(s) were not disturbed during the experiment.

Steel wool was placed on the top of the bottom mounting bracket to produce a PIM signal and then a 13 inch wide (dimension in vertical direction parallel to antenna mast) magnetic film was wrapped around the antenna mast near the bottom mounting bracket. For the magnetic film having a permeability show in FIGS. 9-10, changing the width of the magnetic film from 13 inches to 6.5 inches and/or shifting the position of the film up the mast (away from the bottom mounting bracket) by about 4 inches did not noticeably change the PIM signal.

Steel wool was then placed at each of the top and bottom brackets. Magnetic films (6.5 inch wide strips of 3M™ FFDM EM25TP-0150 which was a multilayer magnetic film having a total thickness of about 250 µm and which included a liner, an adhesive layer, and a magnetic absorber layer having a thickness of 150 µm) were wrapped around the antenna mast at the top or bottom of the top bracket and/or at the top or bottom of the bottom bracket. Placing a magnetic film at the top of the top bracket had little effect on the PIM signal. Placing another magnetic film at the top of the bottom bracket reduced the PIM signal by about 10 dB relative to the case where no magnetic films were present. Removing these magnetic films, reestablishing a baseline for the case where no magnetic films were present, and then placing a magnetic film at the bottom of the top bracket and at the top of the bottom bracket reduced the PIM signal by about 14 dB. Removing these magnetic films, reestablishing a baseline for the case where no magnetic films were present, and then placing magnetic films at the top and bottom of the top bracket and at the top and bottom of the bottom bracket reduced the PIM signal by about 15 dB.

In another experiment, steel wool was placed at the top of each of the top and bottom brackets and then a magnetic film (3M™ FFDM EM25TP-0150) having a width of 3.5 inches, 2.5 inches, or 1 inch was wrapped around the antenna mast at the top of the bottom mounting bracket. For the 3.5 and 2.5 inch widths, the PIM signal was reduced by 9-10 dB. For the 1 inch width the PIM signal was reduced by about 8 dB.

In another experiment, steel wool was placed at the top of the bottom bracket and then a 3.5 inch wide strip of 3M™ FFDM EM25TP-0150 was wrapped around the antenna mast at the top of the bottom bracket and various wrapping fractions were tested. The magnetic film resulted in a 7-8 dB drop in the PIM signal at 100% wrapping Similar results were found for 30%, 50%, and 90% wrapping when the magnetic film faced the steel wool and the uncovered portion of the mast faced away from the steel wool. Significantly less reduction in PIM signal was observed when the uncovered portion of the mast faced the steel wool or when a spiral wrapping was used with a gap between the wraps and the gap between the spiral wrap facing the steel wool.

In another experiment, steel wool was placed at the top of the bottom bracket and then a 3.5 inch wide strip of 3M™ FFDM EM25TP was wrapped (a single full turn) around the antenna mast at the top of the bottom bracket and various thicknesses of the magnetic absorber layer were tested: EM25TP-0025 having a magnetic absorber layer with a thickness of 25 µm, EM25TP-0050 having a magnetic absorber layer with a thickness of 50 µm, EM25TP-0100 having a magnetic absorber layer with a thickness of 100 µm, and EM25TP-0150 having a magnetic absorber layer with a thickness of 150 µm were tested. A 1-2 dB decrease in the PIM signal was observed for the 25 µm and 50 µm thick magnetic absorber layers and a 4-5 dB decrease was observed for the 100 µm and 150 µm thick magnetic absorber layers.

In another experiment, steel wool was placed at the top of the bottom bracket and then a 3.5 inch wide strip of magnetic film was wrapped two full turns around the antenna mast at the top of the bottom bracket. 3M™ FFDM EM25TP-0150 and a magnetic film having a 60 µm thick magnetic absorber layer and the permeability shown in FIG. 10 were tested. The magnetic film with the 60 µm thick magnetic absorber layer also included a 10 µm thick adhesive layer. A 6 dB drop in PIM signal was observed for 3M™ FFDM EM25TP-0150 while a 2 dB drop was observed for the magnetic film having the permeability shown in FIG. 10.

In another experiment, steel wool was placed at the top of the bottom bracket and then a 3.5 inch wide strip of magnetic film was wrapped two full turns around the antenna mast at the top of the bottom bracket. The magnetic films tested were 3M™ FFDM EM25TP-0150, the magnetic film including the 10 µm thick adhesive layer and the 60 µm thick magnetic absorber layer with the permeability shown in FIG. 10, and a magnetic film formed from a stack of two of the magnetic films that each included the 10 µm thick adhesive layer and the 60 µm thick magnetic absorber layer with the permeability shown in FIG. 10. An approximately 4-5 dB drop in PIM signal was observed for the 3M™ FFDM EM25TP-0150 film while a 2-3 dB drop was observed for the film with two 60 µm thick magnetic absorber layers and a 1-2 dB drop was observed for the magnetic film with a single 60 µm thick magnetic absorber layer.

Terms such as "about" will be understood in the context in which they are used and described in the present description by one of ordinary skill in the art. If the use of "about" as applied to quantities expressing feature sizes, amounts, and physical properties is not otherwise clear to one of ordinary skill in the art in the context in which it is used and described in the present description, "about" will be understood to mean within 10 percent of the specified value. A quantity given as about a specified value can be precisely the specified value. For example, if it is not otherwise clear to one of ordinary skill in the art in the context in which it is used and described in the present description, a quantity having a value of about 1, means that the quantity has a value between 0.9 and 1.1, and that the value could be 1.

All references, patents, and patent applications referenced in the foregoing are hereby incorporated herein by reference in their entirety in a consistent manner. In the event of inconsistencies or contradictions between portions of the incorporated references and this application, the information in the preceding description shall control.

Descriptions for elements in figures should be understood to apply equally to corresponding elements in other figures, unless indicated otherwise. Although specific embodiments have been illustrated and described herein, it will be appreciated by those of ordinary skill in the art that a variety of alternate and/or equivalent implementations can be substituted for the specific embodiments shown and described without departing from the scope of the present disclosure. This application is intended to cover any adaptations or variations of the specific embodiments discussed herein. Therefore, it is intended that this disclosure be limited only by the claims and the equivalents thereof.

What is claimed is:

1. A wireless communication system comprising:
   a transmitter configured to transmit at least first and second radio waves having respective different frequencies F1 and F2;
   one or more electrically conductive passive substantially linear medium portions;
   one or more electrically conductive passive substantially nonlinear medium portions disposed proximate the one or more electrically conductive passive substantially linear medium portions; and
   one or more materials covering at least a first portion of the one or more passive substantially linear medium portions and no more than about 20% of the one or more electrically conductive passive substantially nonlinear medium portions; such that when the transmitter transmits the first and second radio waves, the electrically conductive passive substantially linear and nonlinear medium portions receive the first and second radio waves and generate first and second signals propagating therein at the respective frequencies F1 and F2, at least one intermodulation signal being generated in the one or more passive substantially nonlinear medium portions from the first and second signals, the at least one intermodulation signal having a frequency F3 equal to nF1+mF2, m and n positive or negative integers, the one or more materials reducing the generation of the at least one intermodulation signal by at least 2 dB.

2. The wireless communication system of claim 1, wherein any intermodulation signal generated in the one or more passive substantially linear medium portions from the first and second signals has an amplitude A, wherein an amplitude of the at least one intermodulation signal generated in the one or more passive substantially nonlinear medium portions is B, B greater than A by at least 3 dB.

3. The wireless communication system of claim 1, wherein a first magnetic film comprises at least some of the one or more materials, the first magnetic film at least partially wrapping around the first passive substantially linear medium.

4. The wireless communication system of claim 3, wherein the first magnetic film only partially wraps around the first passive substantially linear medium leaving a portion of the passive substantially linear medium exposed between opposite ends of the first magnetic film, the exposed portion facing away from the first passive substantially nonlinear medium.

5. The wireless communication system of claim 3, wherein the first magnetic film helically wraps around the first passive substantially linear medium.

6. The wireless communication system of claim 1, wherein the one or more passive substantially linear medium portions comprises a portion of a support structure for supporting the transmitter, and the one or more passive substantially nonlinear medium portions are attached to the support structure.

7. The wireless communication system of claim 1, wherein a difference between F1 and F2 is between about 5 MHz and about 1 GHz.

8. The wireless communication system of claim 1, wherein each of F1 and F2 is between about 100 MHz and about 10 GHz.

9. A wireless communication system comprising:
   a transmitter configured to transmit at least first and second radio waves having respective different frequencies F1 and F2;
   one or more electrically conductive passive substantially nonlinear medium portions;
   one or more electrically conductive passive substantially linear medium portions disposed proximate the one or more passive substantially nonlinear medium portions, such that when the transmitter transmits the first and second radio waves, the one or more passive substantially linear medium portions receives the first and second radio waves and generates first and second signals at the respective frequencies F1 and F2, the first and second signals propagating in the one or more passive substantially linear medium portions toward the electrically conductive first passive substantially nonlinear medium portions along a first path, an intermodulation signal being generated in the one or more passive substantially nonlinear medium portions from the first and second signals, the intermodulation signal having a frequency F3 equal to nF1+mF2, m and n positive or negative integers; and
   one or more materials covering at least a first portion of the one or more passive substantially linear medium portions along the first path and disposed to attenuate the generated first and second signals propagating in the one or more passive substantially linear medium portions more than the generated intermodulation signal in the one or more passive substantially nonlinear medium portion.

10. The wireless communication system of claim 9, wherein any intermodulation signal generated in the one or more passive substantially linear medium portions from the first and second signals has an amplitude A, wherein an amplitude of the intermodulation signal generated in the one or more passive substantially nonlinear medium portions is B, B greater than A by at least 3 dB.

11. The wireless communication system of claim 9, wherein at least first and second intermodulation signals are generated in the one or more passive substantially nonlinear medium portions from the first and second signals, the first and second intermodulation signals having respective different frequencies F3 and F3', each of F3 and F3' equal to nF1+mF2, m and n positive or negative integers, the one or more materials reducing each of the first and second intermodulation signals by at least 2 dB.

12. The wireless communication system of claim 9, wherein a difference between F1 and F2 is between about 5 MHz and about 1 GHz.

13. The wireless communication system of claim 9, wherein each of F1 and F2 is between about 100 MHz and about 10 GHz.

14. A system for reducing passive intermodulation, the system comprising:

one or more electrically conductive passive substantially linear medium portions configured to receive first and second radio waves having respective different frequencies F1 and F2 and generate first and second signals at the respective frequencies F1 and F2, the first and second signals propagating in the one or more passive substantially linear medium portions toward one or more electrically conductive first passive substantially nonlinear medium portions along a first path, an intermodulation signal being produced in the one or more passive substantially nonlinear medium portions from the first and second signals, the intermodulation signal having a frequency F3 equal to nF1+mF2, m and n positive or negative integers; and one or more materials covering at least a first portion of the one or more passive substantially linear medium portions along the first path and no more than about 20% of the one or more passive substantially nonlinear medium portions.

15. The system of claim 14, wherein any intermodulation signal produced in the one or more passive substantially linear medium portions from the first and second signals has an amplitude A, wherein an amplitude of the intermodulation signal produced in the one or more passive substantially nonlinear medium portions is B, B greater than A by at least 3 dB.

16. The system of claim 14 further comprising a receiver, such that when the intermodulation signal is produced, the intermodulation signal radiates a radio wave at the frequency F3, and the receiver detects the radiated radio wave, the first magnetic film reducing the radiated radio wave detected by the receiver by at least 2 dB.

17. A system for reducing passive intermodulation, the system comprising:

one or more electrically conductive first passive substantially linear medium portions configured to receive first and second radio waves having respective different frequencies F1 and F2 and generate first and second signals at the respective frequencies F1 and F2, the first and second signals propagating in the one or more passive substantially linear medium portions toward an electrically conductive one or more passive substantially nonlinear medium portions along a first path, an intermodulation signal being produced in the one or more passive substantially nonlinear medium portions from the first and second signals, the intermodulation signal having a frequency F3 equal to nF1+mF2, m and n positive or negative integers; and one or more materials covering a first portion of the one or more passive substantially linear medium portions along the first path and leaving exposed a second portion of the one or more passive substantially linear medium portions, wherein the one or more materials face the one or more passive substantially nonlinear medium portions and the second portion faces away from the one or more passive substantially nonlinear medium portions.

18. The system of claim 17, wherein any intermodulation signal produced in the one or more passive substantially linear medium portions from the first and second signals has an amplitude A, wherein an amplitude of the intermodulation signal produced in the one or more passive substantially nonlinear medium portions is B, B greater than A by at least 3 dB.

19. The system of claim 17 further comprising a receiver, such that when the intermodulation signal is produced, the intermodulation signal radiates a radio wave at the frequency F3, and the receiver detects the radiated radio wave, the one or more materials reducing the radiated radio wave detected by the receiver by at least 2 dB.

* * * * *